(12) United States Patent
Mukaiyama et al.

(10) Patent No.: US 12,658,412 B2
(45) Date of Patent: Jun. 16, 2026

(54) ETCHING METHOD AND PLASMA PROCESSING APPARATUS

(71) Applicant: Tokyo Electron Limited, Tokyo (JP)

(72) Inventors: Koki Mukaiyama, Miyagi (JP); Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 18/225,801

(22) Filed: Jul. 25, 2023

(65) Prior Publication Data

US 2024/0030010 A1     Jan. 25, 2024

(30) Foreign Application Priority Data

| Jul. 25, 2022 | (JP) | ................................ | 2022-118067 |
| Apr. 12, 2023 | (JP) | ................................ | 2023-064698 |
| Jun. 29, 2023 | (JP) | ................................ | 2023-106923 |

(51) Int. Cl.
*H01J 37/32* (2006.01)

(52) U.S. Cl.
CPC .. *H01J 37/32724* (2013.01); *H01J 37/32816* (2013.01); *H01J 2237/2001* (2013.01); *H01J 2237/3342* (2013.01)

(58) Field of Classification Search
CPC .................................................. H10W 20/081
See application file for complete search history.

(56) References Cited

U.S. PATENT DOCUMENTS

| 2008/0142988 | A1* | 6/2008 | Hyland | ............. | H01L 21/76814 |
| | | | | | 257/E21.241 |
| 2015/0357202 | A1* | 12/2015 | Thedjoisworo | ... | H01L 21/31138 |
| | | | | | 156/345.24 |
| 2022/0238315 | A1* | 7/2022 | Ohuchida | ......... | H01L 21/31138 |
| 2024/0312771 | A1* | 9/2024 | Takino | ............. | H01L 21/31116 |

FOREIGN PATENT DOCUMENTS

JP          2003-188139 A       7/2003

OTHER PUBLICATIONS

"Hydrofluoric Acid Properties" by Honeywell Specialty Chemicals pp. 1-26 via https://www.physics.purdue.edu/primelab/safety/Hydrofluoric%20Acid/articles/09_Properties_Honeywell.pdf (Year: 2002).*

* cited by examiner

*Primary Examiner* — Binh X Tran
(74) *Attorney, Agent, or Firm* — XSENSUS LLP

(57) ABSTRACT

An etching method includes: (a) providing a substrate including a base film and a mask having an opening and formed on the base film; (b) etching the base film using plasma; and (c) supplying hydrogen fluoride to the substrate under a pressure of 13.3 Pa or higher.

22 Claims, 32 Drawing Sheets

FIG. 18A

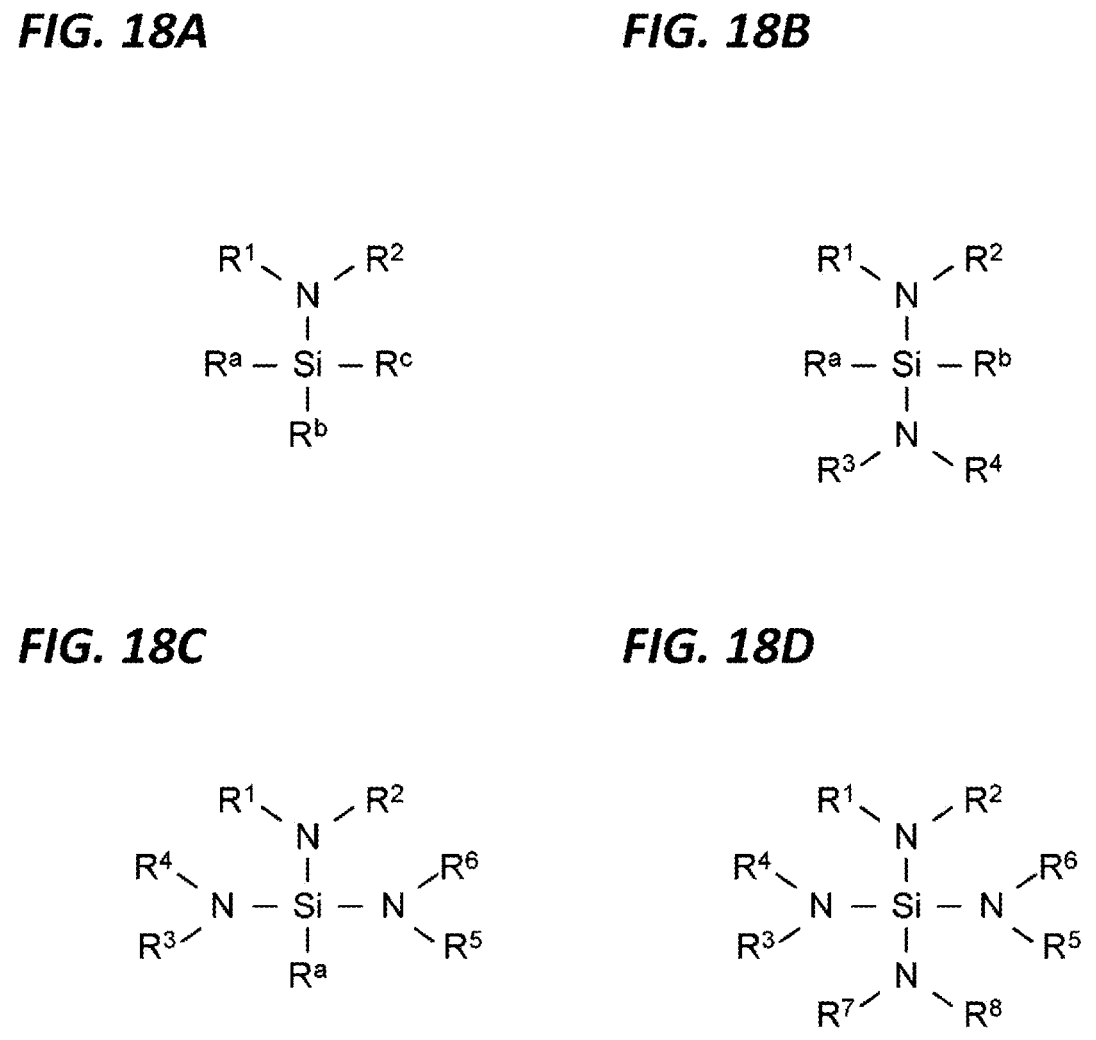

$$R^1 \diagdown N \diagup R^2$$
$$|$$
$$R^a - Si - R^c$$
$$|$$
$$R^b$$

FIG. 18B

$$R^1 \diagdown N \diagup R^2$$
$$|$$
$$R^a - Si - R^b$$
$$|$$
$$N$$
$$R^3 \diagup \diagdown R^4$$

FIG. 18C

$$R^1 \diagdown N \diagup R^2$$
$$R^4 \diagdown \quad | \quad \diagup R^6$$
$$R^3 \diagup N - Si - N \diagdown R^5$$
$$|$$
$$R^a$$

FIG. 18D

$$R^1 \diagdown N \diagup R^2$$
$$R^4 \diagdown \quad | \quad \diagup R^6$$
$$R^3 \diagup N - Si - N \diagdown R^5$$
$$|$$
$$N$$
$$R^7 \diagup \diagdown R^8$$

MT4

START

PROVIDE SUBSTRATE INCLUDING BASE FILM AND
MASK HAVING OPENING AND FORMED ON BASE FILM ~ST1

ETCH BASE FILM USING PLASMA ~ST2

PREFERENTIALLY FORM DEPOSIT ON MASK ~ST31

SUPPLY HYDROGEN FLUORIDE TO MASK ~ST3

ETCH BASE FILM USING PLASMA ~ST4

END

*FIG. 24B*
*FIG. 24A*
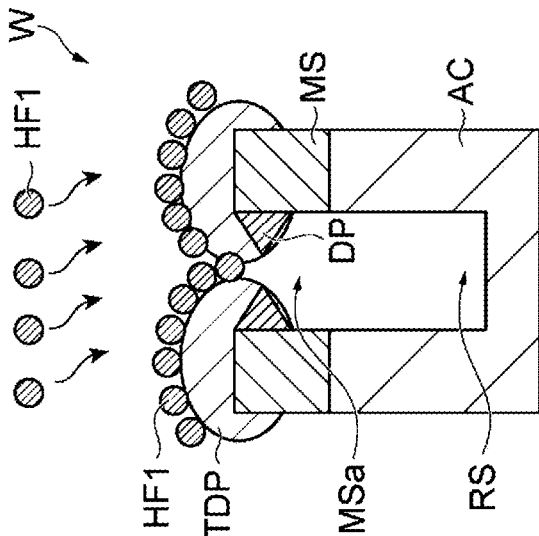
*FIG. 24C*
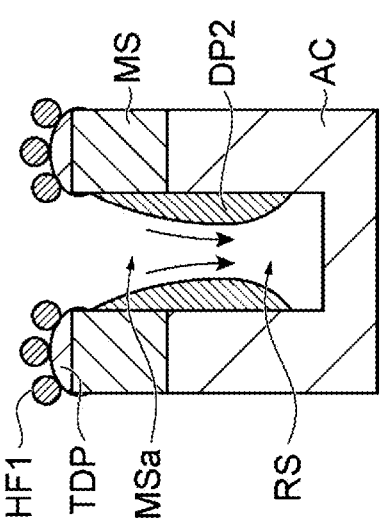
*FIG. 24D*

ETCHING METHOD AND PLASMA PROCESSING APPARATUS

CROSS-REFERENCE TO RELATED APPLICATIONS

This application is based on and claims priority from Japanese Patent Application Nos. 2022-118067, 2023-064698, and 2023-106923, filed on Jul. 25, 2022, Apr. 12, 2023, and Jun. 29, 2023, respectively, with the Japan Patent Office, the disclosures of which are incorporated herein in their entireties by reference.

TECHNICAL FIELD

The present disclosure relates to an etching method and a plasma processing apparatus.

BACKGROUND

Japanese Patent Laid-Open Publication No. 2003-188139 discloses a method of removing etching residues adhering to a semiconductor substrate by using a peeling liquid containing fluorine.

SUMMARY

According to an embodiment of the present disclosure, an etching method includes: (a) providing a substrate including a base film and a mask formed on the base film, and the mask having an opening; (b) etching the base film using plasma; and (c) supplying hydrogen fluoride to the substrate under a pressure of 13.3 Pa or higher.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 18A to 18D are views illustrating an example of a structural formula of aminosilane.

FIGS. 24A to 24D are each a cross-sectional view illustrating a step of an etching method according to an embodiment.

DETAILED DESCRIPTION

Figure 1:
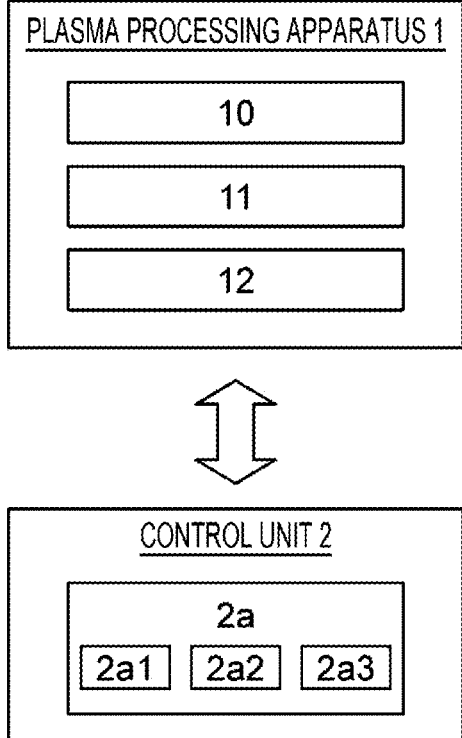
FIG. 1 is a view schematically illustrating a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described in detail with reference to the drawings. In the respective drawings, similar or corresponding components will be denoted by the same reference numerals.

FIG. 1 is a view illustrating an example of a configuration of a plasma processing system. In an embodiment, a plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generation unit 12. The plasma processing chamber 10 has a plasma processing space. Further, the plasma processing chamber 10 includes at least one gas supply port for supplying at least one processing gas into the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed inside the plasma processing space, and has a substrate support surface for supporting a substrate thereon.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP). Various types of plasma generation units including an alternating current (AC) plasma generation unit and a direct current (DC) plasma generation unit may be used. In an embodiment, an AC signal (AC power) used in the AC plasma generation unit has a frequency within the range of 100 kHz to 10 GHz. Accordingly, the AC signal includes a radio frequency (RF) signal and a microwave signal. In an embodiment, the RF signal has a frequency within the range of 100 kHz to 150 MHz.

The control unit 2 processes computer-executable commands for causing the plasma processing apparatus 1 to perform various steps described herein below. The control unit 2 may be configured to control each component of the plasma processing apparatus 1 to perform the various steps described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read programs from the storage unit 2a2, and perform various control operations by executing the read programs. The programs may be stored in the storage unit 2a2 in advance, or may be acquired via a medium when necessary. The acquired programs are stored in the storage unit 2a2, and read from the storage unit 2a2 to be executed by the processing unit 2a1. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
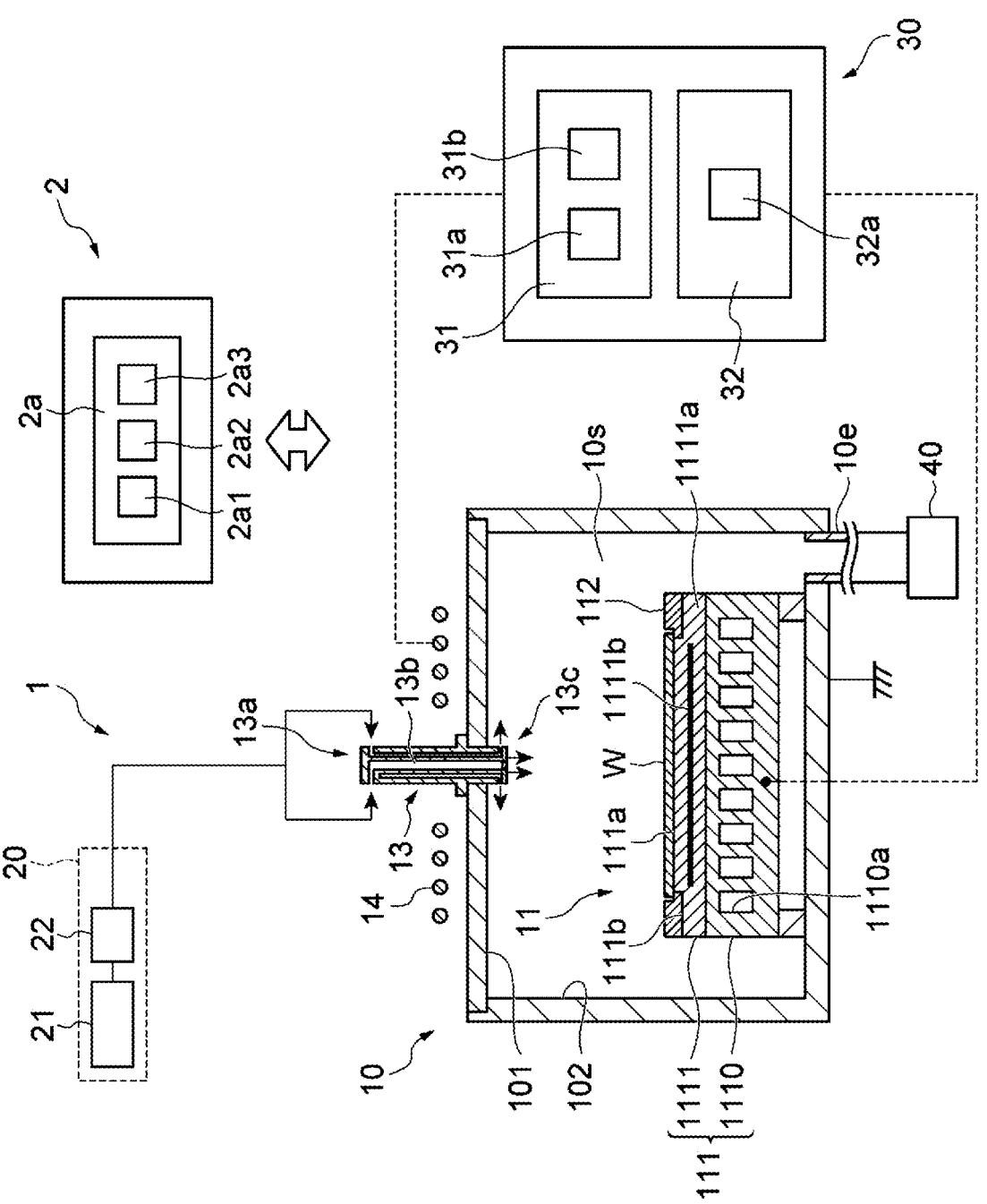
FIG. 2 is a view schematically illustrating a plasma processing apparatus according to an embodiment.

Hereinafter, an example of a configuration of a capacitively coupled plasma processing apparatus, which is an example of the plasma processing apparatus 1, will be described. FIG. 2 is a view illustrating an example of the configuration of the capacitively coupled plasma processing apparatus.

The capacitively coupled plasma processing apparatus 1 includes a plasma processing chamber 10, a gas supply unit 20, a power supply 30, and an exhaust system 40. The plasma processing chamber 10 includes a dielectric window

101. Further, the plasma processing apparatus 1 includes the substrate support 11, a gas introduction unit, and an antenna 14. The substrate support 11 is disposed inside the plasma processing chamber 10. The antenna 14 is disposed on or above the plasma processing chamber 10 (i.e., on or above the dielectric window 101). The plasma processing chamber 10 has a plasma processing space 10s defined by the dielectric window 101, the side wall 102 of the plasma processing chamber 10, and the substrate support 11. The plasma processing chamber 10 is grounded.

The substrate support 11 includes a main body 111 and a ring assembly 112. The main body 111 has a central region 111a for supporting a substrate W, and an annular region 111b for supporting the ring assembly 112. An example of the substrate W is a wafer. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W placed on the central region 111a of the main body 111. Accordingly, the central region 111a is also referred to as a substrate support surface for supporting the substrate W, and the annular region 111b is also referred to as a ring support surface for supporting the ring assembly 112.

In an embodiment, the main body 111 includes a base 1110 and an electrostatic chuck 1111. The base 1110 includes a conductive member. The conductive member of the base 1110 may function as a bias electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to an RF power supply 31 and/or a DC power supply 32 to be described later may be disposed inside the ceramic member 1111a. In this case, at least one RF/DC electrode functions as a bias electrode. Further, the conductive member of the base 1110 and at least one RF/DC electrode may function as a plurality of bias electrodes. The electrostatic electrode 1111b may function as a bias electrode. Thus, the substrate support 11 includes at least one bias electrode.

The ring assembly 112 includes one or more annular members. In an embodiment, the one or more annular members include one or more edge rings and at least one cover ring. The edge ring is made of a conductive material or an insulating material, and the cover ring is made of an insulating material.

The substrate support 11 may include a temperature adjustment module configured to adjust at least one of the electrostatic chuck 1111, the ring assembly 112, and the substrate to a target temperature. The temperature adjustment module may include a heater, a heat transfer medium, a flow path 1110a, or a combination thereof. A heat transfer fluid such as brine and a gas flows through the flow path. In an embodiment, the flow path 1110a is formed inside the base 1110, and one or more heaters are disposed inside the ceramic member 1111a of the electrostatic chuck 1111. The substrate support 11 may include a heat transfer gas supply unit configured to supply a heat transfer gas to the gap between the back surface of the substrate W and the central region 111a.

The gas introduction unit is configured to introduce at least one processing gas from the gas supply unit 20 into the plasma processing space 10s. In an embodiment, the gas introduction unit includes a center gas injector (CGI) 13. The center gas injector 13 is disposed above the substrate support 11 and is attached to the central opening formed in the dielectric window 101. The center gas injector 13 has at least one gas supply port 13a, at least one gas flow path 13b, and at least one gas introduction port 13c. A processing gas supplied to the gas supply port 13a passes through the gas path 13b and is introduced into the plasma processing space 10s from the introduction port 13c. The gas introduction unit may include one or a plurality of side gas injectors (SGI) attached to one or a plurality of openings formed in the side wall 102, in addition to or instead of the center gas injector 13.

The gas supply unit 20 may include at least one gas source 21 and at least one flow rate controller 22. In an embodiment, the gas supply unit 20 is configured to supply at least one processing gas from its corresponding gas source 21 to the gas introduction unit via its corresponding flow rate controller 22. Each flow rate controller 22 may include, for example, a mass flow controller or a pressure-controlled flow rate controller. The gas supply unit 20 may further include at least one flow rate modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one bias electrode and the antenna 14. Thus, plasma is formed from at least one processing gas supplied to the plasma processing space 10s. Accordingly, the RF power supply 31 may function as at least a portion of the plasma generation unit 12. By supplying a bias RF signal to at least one bias electrode, a bias potential is generated in the substrate W so that ion in formed plasma may be attracted to the substrate W.

In an embodiment, the RF power supply 31 includes a first RF generation unit 31a and a second RF generation unit 31b. The first RF generation unit 31a is coupled to the antenna 14 via at least one impedance matching circuit, and configured to generate a source RF signal (source RF power) for generating plasma. In an embodiment, the source RF signal has a frequency in the range of 10 MHz to 150 MHz. In an embodiment, the first RF generation unit 31a may be configured to generate a plurality of source RF signals having different frequencies. One or a plurality of generated RF signals are supplied to the antenna 14.

The second RF generation unit 31b is coupled to at least one bias electrode via at least one impedance matching circuit, and configured to generate a bias RF signal (bias RF power). The frequency of the bias RF signal may be the same as or different from the frequency of the source RF signal. In an embodiment, the bias RF signal has a frequency lower than that of the source RF signal. In an embodiment, the bias RF signal has a frequency in the range of 100 kHz to 60 MHz. In an embodiment, the second RF generation unit 31b may be configured to generate a plurality of bias RF signals having different frequencies. One or a plurality of generated bias RF signals are supplied to at least one bias electrode. In various embodiments, at least one of the source RF signal and the bias RF signal may be pulsed.

The power supply 30 may further include a DC power supply 32 coupled to the plasma processing chamber 10. The DC power supply 32 includes a bias DC generation unit 32a. In an embodiment, the bias DC generation unit 32a is connected to at least one bias electrode, and is configured to generate a bias DC signal. The generated bias DC signal is applied to at least one bias electrode.

In various embodiments, the bias DC signal may be pulsed. In this case, a sequence of voltage pulses is applied to at least one bias electrode. The voltage pulses may have rectangular, trapezoidal, or triangular pulse waveforms, or combined pulse waveforms thereof. In an embodiment, a waveform generation unit is connected between the bias DC generation unit 32a and at least one bias electrode, to generate a sequence of voltage pulses from a DC signal. Thus, the bias DC generation unit 32a and the waveform generation unit make up a voltage pulse generation unit. The voltage pulses may have a positive polarity or a negative polarity. The sequence of voltage pulses may include one or a plurality of positive voltage pulses and one or a plurality of negative voltage pulses in one cycle. The bias DC generation unit 32a may be provided in addition to the RF power supply 31, or may be provided in place of the second RF generation unit 31b.

The antenna 14 includes one or a plurality of coils. In an embodiment, the antenna 14 may include an outer coil and an inner coil, which are arranged coaxially. In this case, the RF power supply 31 may be connected to both the outer and inner coils, or may be connected to either one of the outer and inner coils. In the former case, the same RF generation unit may be connected to both the outer and inner coils, or separate RF generation units may be connected to the outer and inner coils, respectively.

The exhaust system 40 may be connected to a gas discharge port 10e formed at, for example, the bottom of the plasma processing chamber 10. The exhaust system 40 may include a pressure regulation valve and a vacuum pump. The pressure in the plasma processing space 10s is regulated by the pressure regulation valve. The vacuum pump may include a turbo molecular pump, a dry pump, or a combination thereof.

Figure 3:
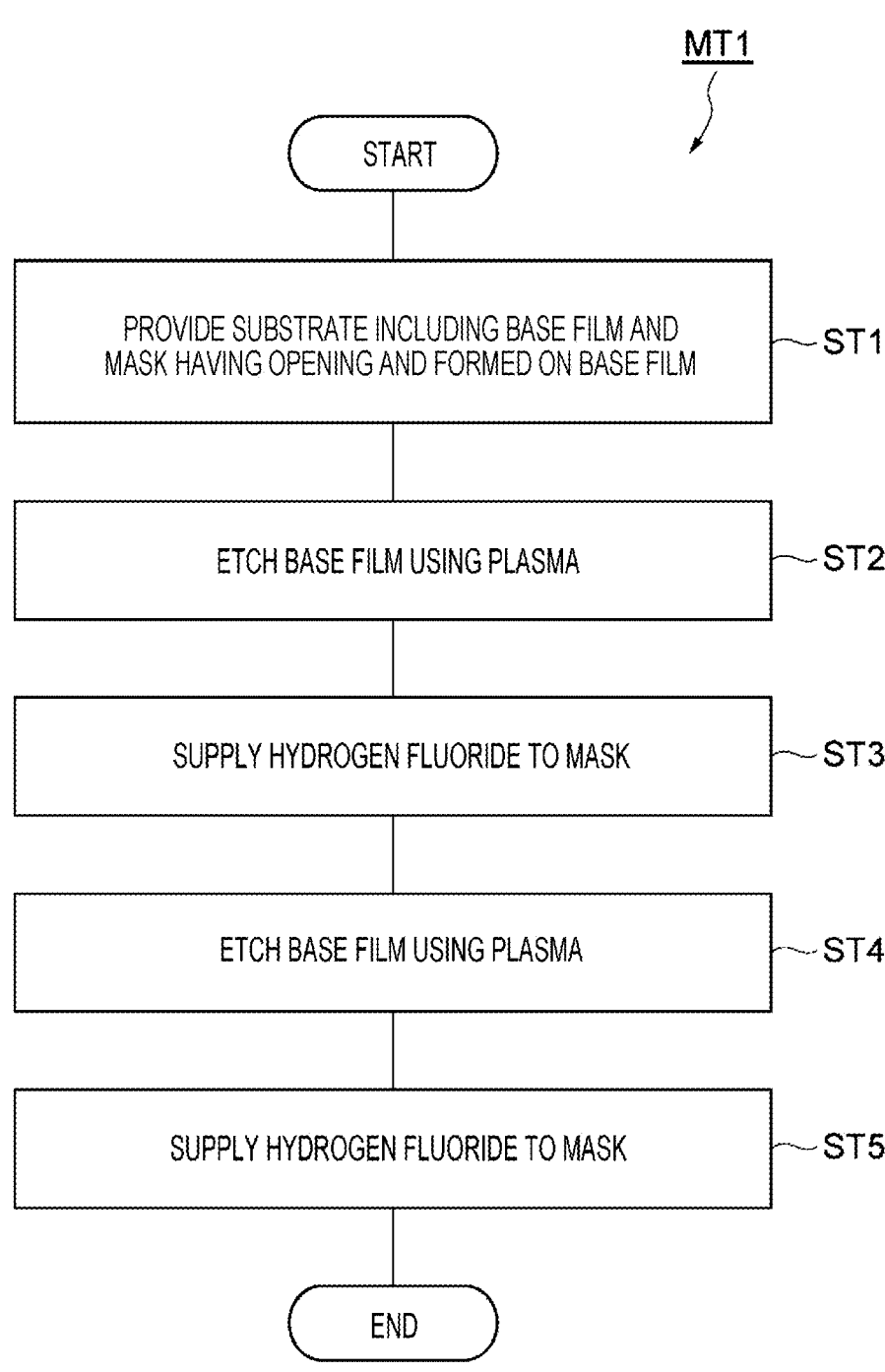
FIG. 3 is a flowchart of an etching method according to an embodiment.

FIG. 3 is a flowchart of an etching method according to an embodiment. An etching method MT1 illustrated in FIG. 3 (hereinafter, referred to as a "method MT1") may be performed by the plasma processing apparatus 1 of the embodiment described above. The method MT1 may be applied to the substrate W.

Figure 4:
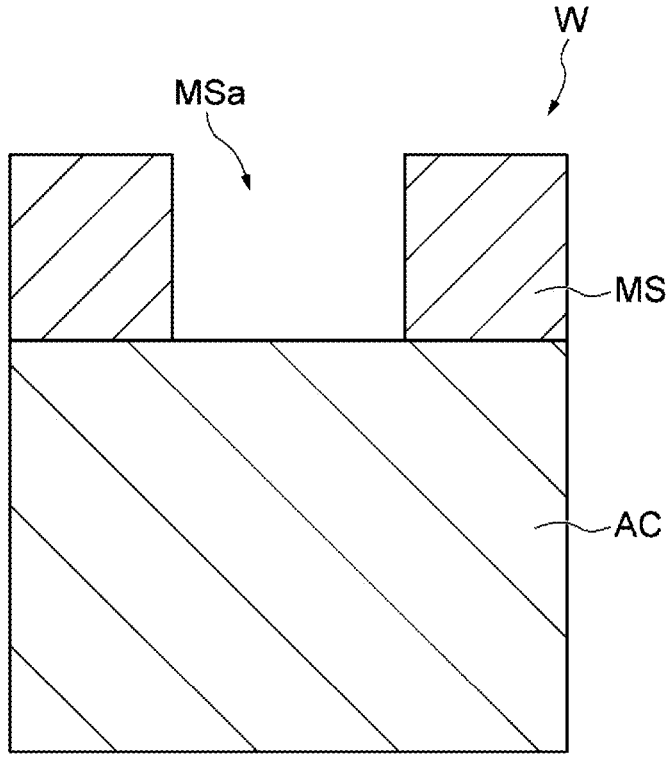
FIG. 4 is a cross-sectional view illustrating an example of a substrate, to which the method of FIG. 3 is applicable.

FIG. 4 is a cross-sectional view illustrating an example of a substrate, to which the method of FIG. 3 may be applied. As illustrated in FIG. 4, in an embodiment, the substrate W includes a base film AC and a mask MS formed on the base film AC. The mask MS has an opening MSa. The opening MSa may include at least one of a hole pattern and a line pattern. The dimension (critical dimension) of the opening MSa may be 100 nm or less. The dimension of the opening MSa is the minimum value of the length across the opening MSa along the surface of the substrate W. The substrate W may have a base region under the base film AC.

The mask MS may contain at least one of silicon, metal, and carbon. The mask MS may include at least one of a silicon-containing film, a metal-containing film, and a carbon-containing film. Examples of the silicon-containing film include silicon oxide film, silicon nitride film, and silicon oxynitride film. Examples of the carbon-containing film include spin-on carbon (SOC) film, amorphous carbon film, and a resist film. Examples of the resist film include an ArF resist film, a KrF resist film, and an EUV resist film. The mask MS may include at least one element selected from the group consisting of phosphorus, boron, and sulfur.

The base film AC may include a different material from the material of the mask MS. The base film AC may contain at least one of silicon, metal, and carbon. The base film AC may include at least one of a silicon-containing film, a metal-containing film, and a carbon-containing film. Examples of the silicon-containing film include silicon oxide film, silicon nitride film, a film having a stacked structure of silicon oxide film and silicon nitride film (ON film), polycrystalline silicon film, amorphous silicon film, silicon germanium (SiGe) film, a film having a stacked structure of silicon film and germanium film, and boron-containing silicon film. The silicon-containing film may include at least one element selected from the group consisting of phosphorus, boron, and nitrogen. Examples of the metal-containing film include a tungsten-containing film and a molybdenum-containing film. Examples of the tungsten-containing film include tungsten carbide (WC) film, WSiN film, tungsten silicide (WSi) film, and tungsten film. Examples of the molybdenum-containing film include molybdenum film. Examples of the carbon-containing film include spin-on carbon (SOC) film, amorphous carbon film, and a resist film. Examples of the resist film include an ArF resist film, a KrF resist film, and an EUV resist film. The base film AC may not include oxygen film.

Figure 5:
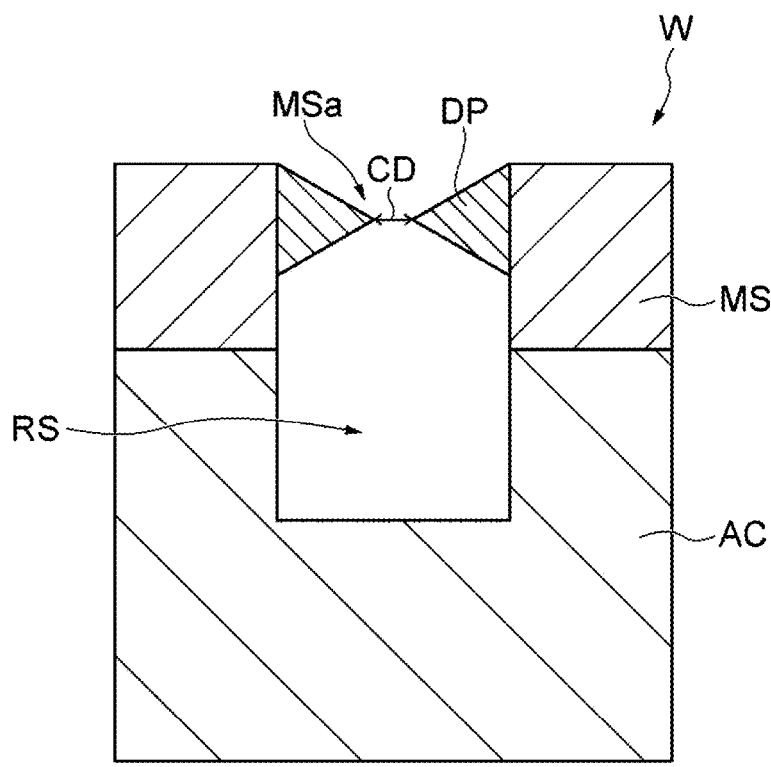
FIG. 5 is a cross-sectional view illustrating a step of an etching method according to an embodiment.
Figure 6:
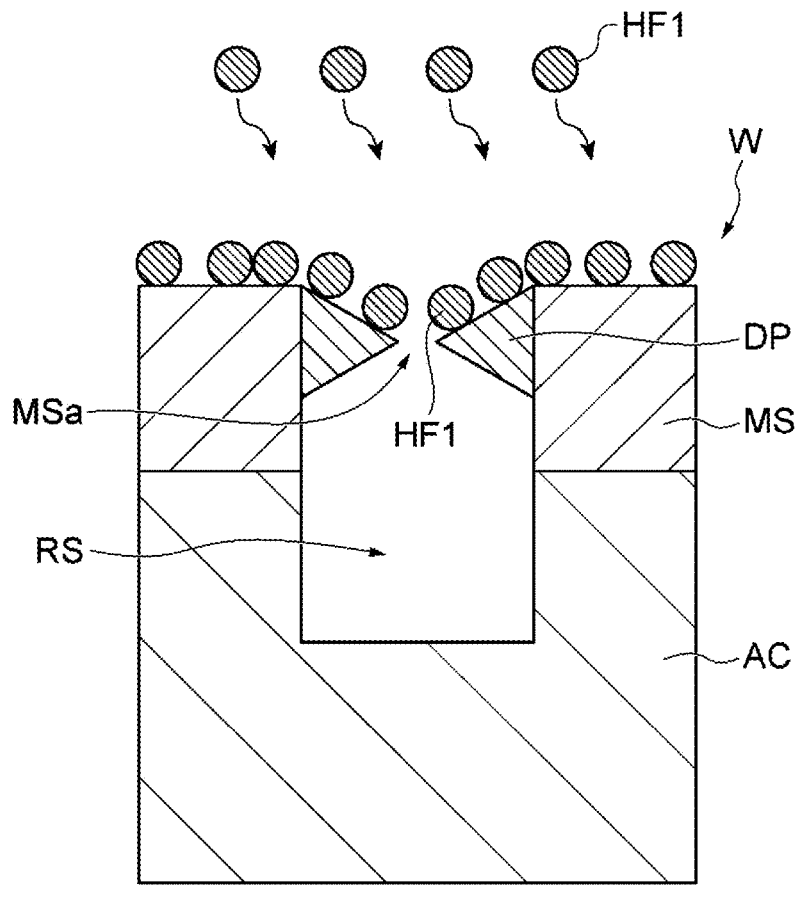
FIG. 6 is a cross-sectional view illustrating a step of an etching method according to an embodiment.
Figure 7:
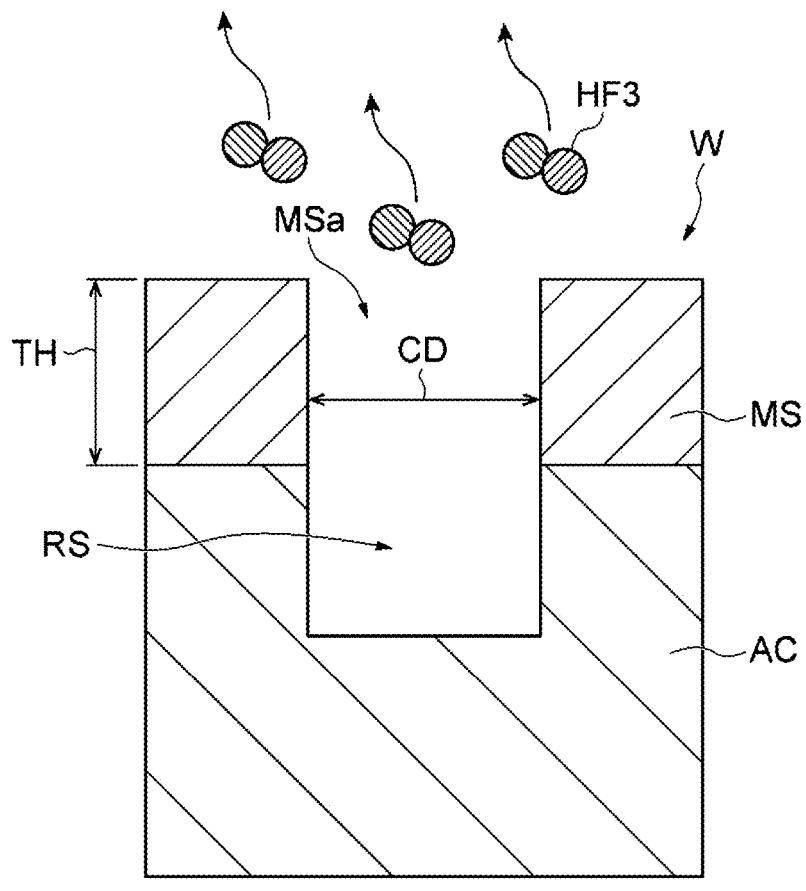
FIG. 7 is a cross-sectional view illustrating a step of an etching method according to an embodiment.

Hereinafter, the method MT1 will be described with reference to FIGS. 3 to 7, assuming, for example, where the method MT1 is applied to the substrate W using the plasma processing apparatus 1 of the embodiment described above. FIGS. 5 to 7 are each a cross-sectional view illustrating a step of an etching method according to an embodiment. When the plasma processing apparatus 1 is used, the method MT1 may be performed in the plasma processing apparatus 1 under the control of each component of the plasma processing apparatus 1 by the control unit 2. In the method MT1, as illustrated in FIG. 2, a processing is performed on the substrate W on the substrate support 11 disposed inside the plasma processing chamber 10.

As illustrated in FIG. 3, the method MT1 may include steps ST1 to ST5. Steps ST1 to ST5 may be sequentially performed. Steps ST1 to ST5 may be performed in situ or in different chambers. For example, steps ST1, ST2, and ST4 may be performed in the plasma processing chamber 10, and steps ST3 and ST5 may be performed in a different chamber from the plasma processing chamber 10. Steps ST3 and ST5 may be performed in a batch or single-wafer process manner. The method MT1 may not include at least one of steps ST4 and ST5.

(Step ST1)

In step ST1, the substrate W of FIG. 4 is provided. The substrate W may be placed on the substrate support 11 disposed inside the plasma processing chamber 10, as illustrated in FIG. 2.

(Step ST2)

In step ST2, the base film AC is etched using plasma, as illustrated in FIG. 5. The plasma may be generated from a first processing gas supplied into the plasma processing chamber 10. The first processing gas may include a fluorine-containing gas. As a result of the etching, a recess RS is formed in the base film AC to correspond to the opening MSa, and a deposit DP may adhere to the opening MSa of the mask MS. The deposit DP may contain silicon and oxygen. The deposit DP may be formed on the side wall of the mask MS that defines the opening MSa. The dimension CD of the opening MSa of the mask MS may be decreased due to the deposit DP.

(Step ST3)

In step ST3, hydrogen fluoride is supplied to the mask MS to remove the deposit DP, as illustrated in FIGS. 6 and 7. In an embodiment, a second processing gas that includes hydrogen fluoride gas is supplied into the plasma processing chamber 10. Hydrogen fluoride molecules HF1 of the hydrogen fluoride gas react with the deposit DP, and as a result, reaction products HF3 such as silicon fluoride may be produced. The deposit DP may be removed in the manner that the reaction products HF3 are volatilized. In an embodiment, the second processing gas that includes the hydrogen fluoride gas is supplied without generating plasma. In this case, the etching of the mask MS by plasma may be suppressed. As a result, the deformation of the mask MS may be suppressed. In another embodiment, plasma may be generated from the second processing gas that includes the hydrogen fluoride gas. When plasma is generated, the source RF power may be equal to or less than 1,000 W, and the bias power supplied to the substrate support 11 may be 0 W.

The second processing gas may further include a hydrogen-containing gas. As a result, the hydrogen-containing gas may be supplied to the mask MS. The hydrogen-containing gas may contain oxygen. Examples of the hydrogen-containing gas include water or water vapor ($H_2O$), $C_xH_yO_z$ gas ($x \geq 0$, y, $z \geq 1$) such as methanol ($CH_3OH$), ethanol ($C_2H_5OH$), or acetic acid ($CH_3COOH$), phosphoric acid ($H_3PO_4$), sulfuric acid ($H_2SO_4$), hydrogen peroxide ($H_2O_2$), nitric acid ($HNO_3$), and ammonia ($NH_3$). The second process gas may further include a noble gas. The flow rate of the hydrogen fluoride gas may be the largest among the gases included in the second processing gas.

The pressure in step ST3 may be 13.3 Pa (100 mTorr) or more, or may be 40 Pa (300 mTorr) or more. The pressure in step ST3 may be equal to or less than the saturated vapor pressure of hydrogen fluoride. The pressure in step ST3 may be $1.33 \times 10^5$ Pa (1,000 Torr) or less, 133 Pa (1 Torr) or less, 120 Pa (900 mTorr) or less, or 107 Pa (800 mTorr) or less. The pressure in step ST3 may be 13.3 Pa (100 mTorr) to 133 Pa (1 Torr), or 40 Pa (300 mTorr) to 107 Pa (800 mTorr).

In step ST3, the temperature of the substrate support 11 may be −80° C. or higher or −60° C. or higher. In step ST3, the temperature of the substrate support 11 may be 100° C. or lower, 50° C. or lower, 40° C. or lower, 30° C. or lower, or 20° C. or lower. In step ST3, the temperature of the substrate support 11 may be −80° C. to 50° C., −60° C. to 20° C., or 0° C. to 40° C.

The duration of step ST3 may be 1 second or longer, 10 seconds or longer, or 1 minute or longer. The duration of step ST3 may be 10 minutes or shorter, 5 minutes or shorter, or 3 minutes or shorter.

(Step ST4)

In step ST4, similarly to step ST2, the base film AC is etched using plasma.

(Step ST5)

In step ST5, similarly to step ST3, hydrogen fluoride is supplied to the mask MS to remove the deposit DP formed in step ST4.

After step ST5, steps ST2 and ST3 may be further repeated. As a result, the recess RS may be deepened.

According to the method MT1 above, the deposit DP may be removed by hydrogen fluoride during steps ST3 and ST5. The deposit DP may be removed by a chemical reaction with hydrogen fluoride. The mechanism for removing the deposit DP is described as follows, but is not limited thereto. When the pressure in steps ST3 and ST5 is 13.3 Pa (100 mTorr) or more, the amount of hydrogen fluoride molecules adsorbed to the deposit DP increases, so that more deposit DP is removed. When the temperature of the substrate support 11 is high during steps ST3 and ST5, the reaction between hydrogen fluoride and the deposit DP is accelerated, so that more deposit DP is removed. By removing the deposit DP, the blockage (clogging) of the opening MSa of the mask MS may be suppressed. Therefore, the dimension CD of the opening MSa expands through steps ST3 and ST5, as illustrated in FIG. 7.

Further, the deposit DP may be removed selectively with respect to the mask MS by hydrogen fluoride. Thus, the deformation of the mask MS is suppressed. As a result, the decrease in thickness TH of the mask MS illustrated in FIG. 7 may be suppressed.

When the hydrogen-containing gas is supplied to the mask MS during steps ST3 and ST5, the hydrogen-containing gas accelerates the adsorption of the hydrogen fluoride molecules to the deposit DP. As a result, more deposit DP is removed.

Figure 8:
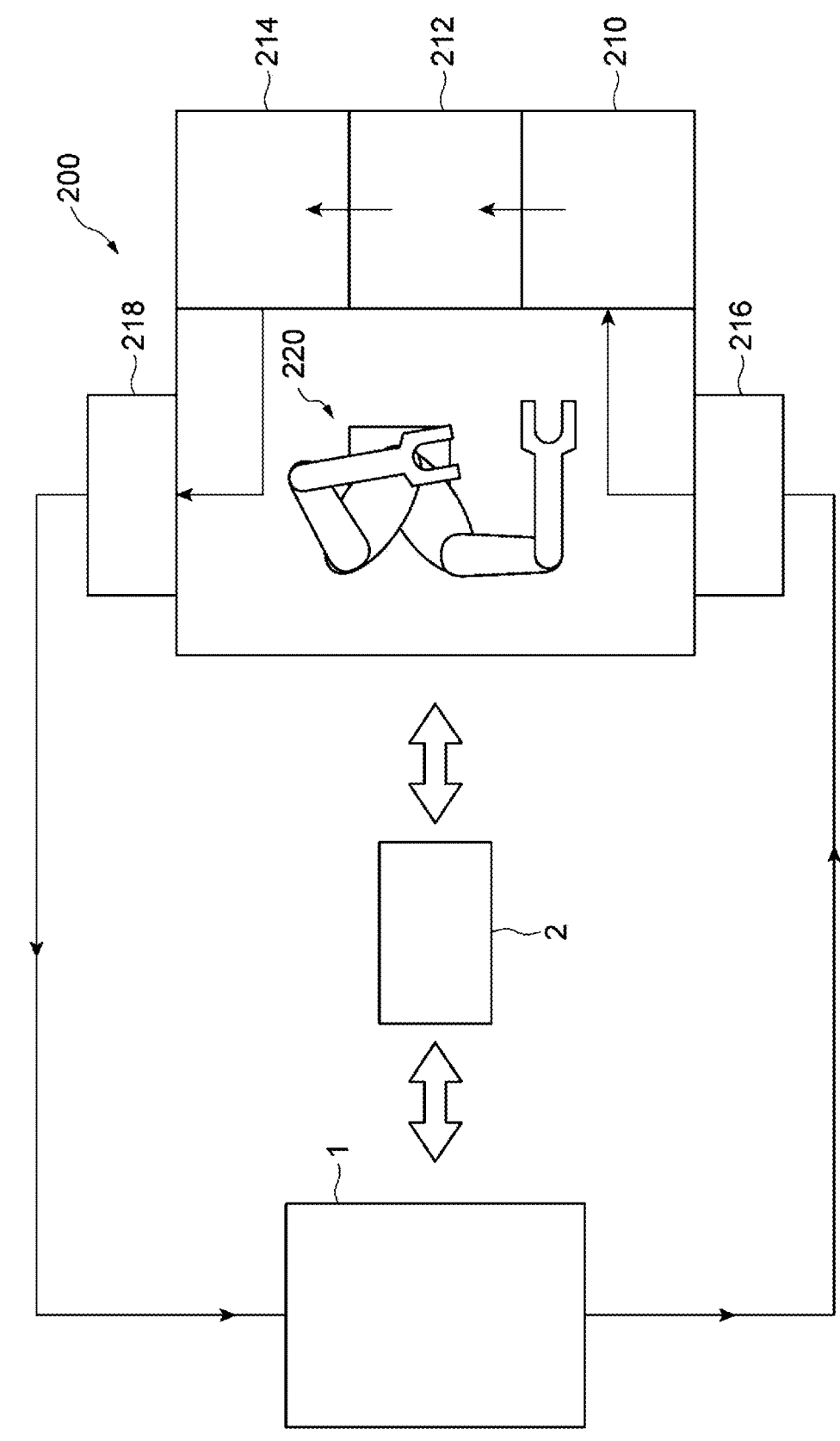
FIG. 8 is a view schematically illustrating a substrate processing apparatus according to an embodiment.

FIG. 8 is a view schematically illustrating a substrate processing apparatus according to an embodiment. The method MT1 may be applied to the substrate W using the substrate processing apparatus illustrated in FIG. 8.

The substrate processing apparatus of FIG. 8 includes the plasma processing apparatus 1, the control unit 2, and a wet processing apparatus 200. The substrate processing apparatus may include a transfer robot that transfers the substrate W between the plasma processing apparatus 1 and the wet processing apparatus 200. The control unit 2 is configured to control each component of the plasma processing apparatus 1 and the wet processing apparatus 200. The method MT1 may be performed in the substrate processing apparatus of FIG. 8 under the control by the control unit 2.

The wet processing apparatus 200 may include a container 210 that accommodates hydrofluoric acid, a container 212 that accommodates a rinse liquid, and a container 214 that accommodates pure water. The wet processing apparatus 200 may include a dryer that dries the substrate W.

The wet processing apparatus 200 may include a carry-in port 216 for receiving the substrate W carried out from the plasma processing apparatus 1, a carry-out port 218 for carrying out the substrate W to the plasma processing apparatus 1, and a transfer robot 220 for transferring the substrate W. The transfer robot 220 transfers the substrate W from the carry-in port 216 to the container 210. The transfer robot 220 transfers the substrate W from the container 210 to the container 212. The transfer robot 220 transfers the substrate W from the container 212 to the container 214. The transfer robot 220 transfers the substrate W from the container 214 to the carry-out port 218.

When the method MT1 is performed in the substrate processing apparatus of FIG. 8, steps ST1, ST2, and ST4 may be performed in the plasma processing apparatus 1. Steps ST3 and ST5 may be performed in the wet processing apparatus 200. In steps ST3 and ST5, hydrofluoric acid is supplied to the substrate W. As a result, the deposit DP is removed by hydrofluoric acid. The substrate W may be immersed in hydrofluoric acid inside the container 210. Then, the substrate W may be immersed in a rinse liquid inside the container 212. Then, the substrate W may be immersed in pure water inside the container 214. Then, the substrate W may be dried in the dryer of the wet processing apparatus 200. Alternatively, the substrate W may be dried by reducing the pressure inside the plasma processing chamber 10 of the plasma processing apparatus 1.

The present embodiment may remove the deposit DP uniformly, regardless of regions of the substrate W. As an application of this feature, the removal amount of deposit DP may be changed according to regions of the substrate W. For example, when the substrate support 11 includes a multi-zone temperature control mechanism, the center and the edge of the substrate W may be controlled to different temperatures. Examples of the multi-zone temperature control mechanism include those illustrated in FIG. 9 of US 2007/0235134 A1, FIGS. 6B and 7A to 7E of WO 01/24581 A1, FIG. 2 of US 2014/0263274 A1, and FIGS. 18 to 21 of US 2022/0205105 A1.

Figure 9:
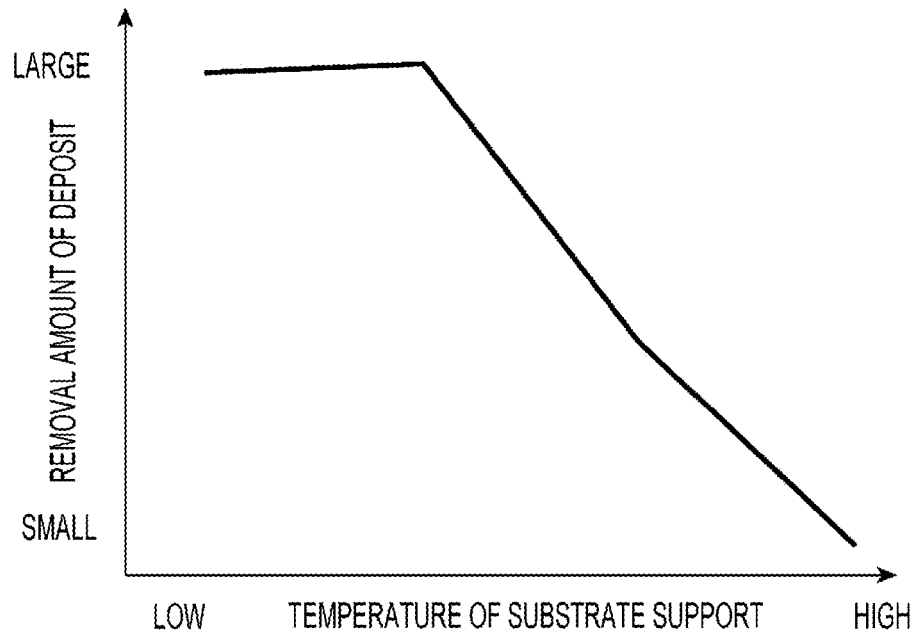
FIG. 9 is a graph representing a relationship between a temperature of a substrate support and a removal amount of a deposit under a certain pressure condition.

FIG. 9 is a graph illustrating the relationship between the temperature of the substrate support 11 and the removal amount of deposit DP under a certain pressure condition. As can be seen from FIG. 9, there is a tendency that the higher the temperature of the substrate support 11, the smaller the removal amount of deposit DP, and the lower the temperature of the substrate support 11, the larger the removal amount of deposit DP. Accordingly, hydrogen fluoride may be supplied allowing the multi-zone temperature control mechanism to control the region of the substrate W with a relatively small amount of deposit DP in the opening MSa of the mask MS (e.g., the center of the substrate W) to a relatively high temperature, and the region of the substrate W with a relatively large amount of deposit DP (e.g., the edge of the substrate W) to a relatively low temperature, so that the removal amount of deposit DP may be changed according to the regions of the substrate W.

Figure 10A:
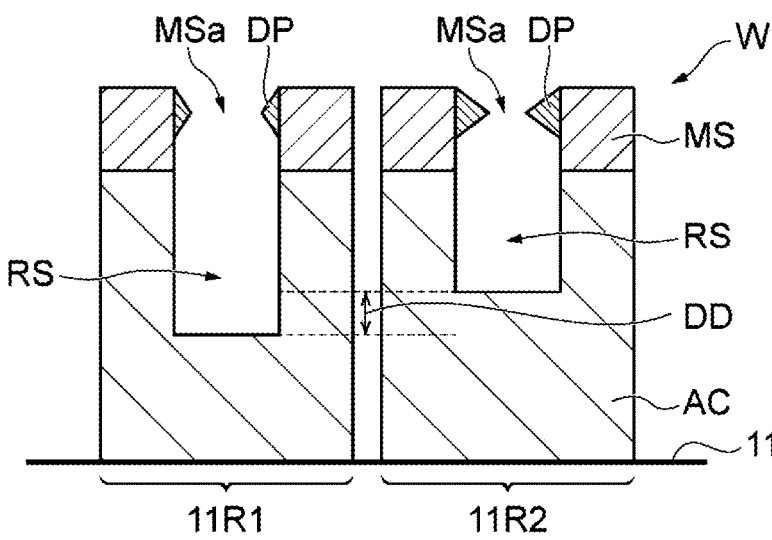
FIGS. 10A to 10C are each a view schematically illustrating the cross sections of the center and the edge of a substrate, when an etching is performed after a deposit is removed while performing a temperature control using a multi-zone temperature control mechanism.
Figure 10B:
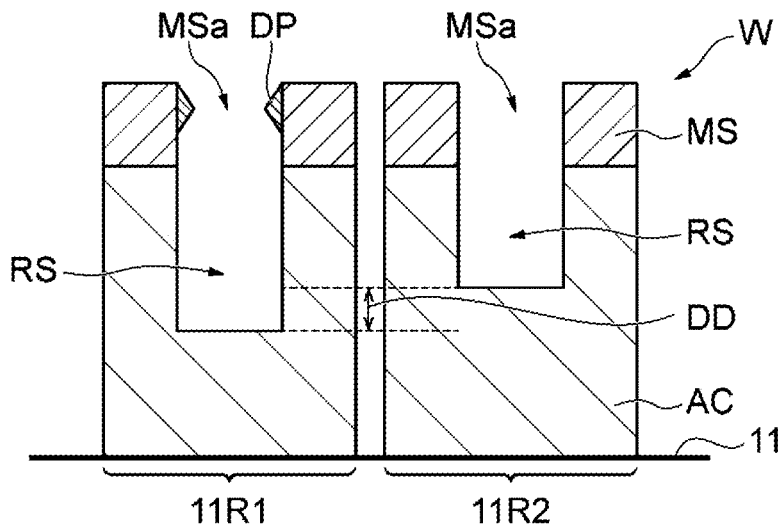
Figure 10C:
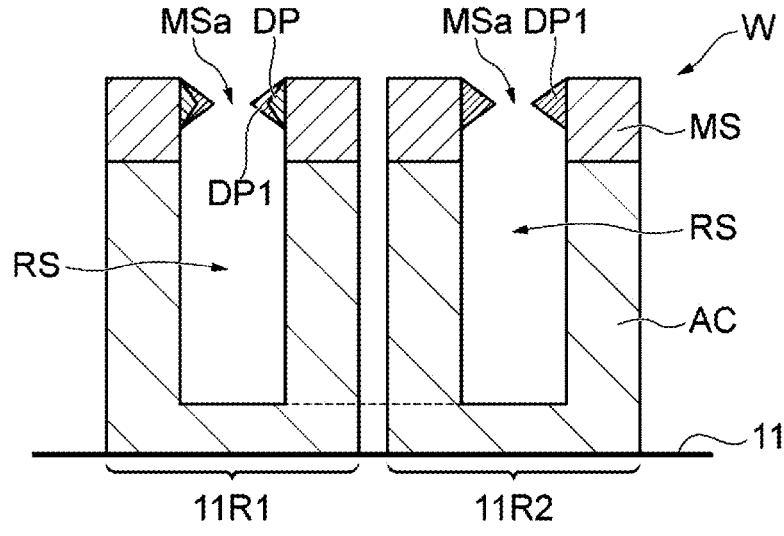

Further, the in-plane uniformity of an etching shape in the substrate W may be improved. FIGS. 10A to 10C are each a view schematically illustrating the cross sections of the center and the edge of the substrate W, when the etching is performed after the deposit DP is removed while controlling the temperature by using the multi-zone temperature control mechanism. In each of FIGS. 10A to 10C, the left represents the cross-section of the center of the substrate W, and the right represents the cross-section of the edge of the substrate W. The center of the substrate W is located on a first region 11R1 of the substrate support 11. The edge of the substrate W is located on a second region 11R2 of the substrate support 11. The second region 11R2 is different from the first region 11R1. During the supply of hydrogen fluoride, the first region 11R1 is controlled to a first temperature, and the second region 11R2 is controlled to a second temperature. The second temperature is different from the first temperature. FIG. 10A is a schematic view before the supply of hydrogen fluoride. FIG. 10B is a schematic view after the supply of hydrogen fluoride. FIG. 10C is a schematic view after the etching.

As illustrated in FIG. 10A, for example, it is assumed that the amount of deposit DP in the opening MSa of the mask MS at the edge of the substrate W is larger than the amount of deposit DP at the center of the substrate W. In this case, the dimension of the opening MSa of the mask MS at the edge of the substrate W becomes smaller than the dimension of the opening MSa of the mask MS at the center of the substrate W. Accordingly, a difference occurs in amount of etchant entering the recess RS, and as a result, the etching depth at the edge of the substrate W becomes shallower than the etching depth at the center of the substrate W. FIG. 10A illustrates an etching depth difference DD. By supplying hydrogen fluoride while controlling the temperature of the edge of the substrate W to be lower than the temperature of the center of the substrate W, the amount of deposit DP at the edge of the substrate W may be reduced from the amount of deposit DP at the center of the substrate W (e.g., FIG. 9). Accordingly, the dimension of the opening MSa of the mask MS at the edge of the substrate W becomes larger than the dimension of the opening MSa of the mask MS at the center of the substrate W. Therefore, more etchant may be supplied into the recess RS at the edge of the substrate W through the subsequent etching. As a result, the etching amount at the edge of the substrate W becomes larger than the etching amount at the center of the substrate W. Therefore, the etching depth difference DD may be reduced, so that the etching depths after the etching may be aligned, as illustrated in FIG. 10C. By the etching, a deposit DP1 further adheres to the opening MSa of the mask MS.

While descriptions have been made on the example where the deposit DP adhering to the opening MSa of the mask MS is removed, the present disclosure is not limited to merely the example. As another embodiment, it may be assumed that when a by-product generated by an etching of the base film AC adheres to the side wall or the bottom of the recess RS formed by the etching, the by-product is removed by supplying hydrogen fluoride to the substrate W. In this embodiment, even when the by-product adheres to a portion of the side wall or the bottom, the by-product may be preferentially removed by hydrogen fluoride, which thus reduces the concern about damaging the shape of the recess RS. As yet another embodiment, it may be assumed that when the by-product generated by the etching of the base film AC is scattered as particles on the substrate W, the particles are removed by supplying hydrogen fluoride to the substrate W. According to these embodiments, the deposits adhering to the substrate W may be removed by supplying hydrogen fluoride to the substrate W.

Hereinafter, various experiments conducted for evaluating the method MT1 will be described. The experiments described below are not intended to limit the present disclosure.

1st Experiment

In a 1st experiment, a substrate including an amorphous carbon film and a mask formed on the amorphous carbon film was prepared. The mask is a silicon oxynitride film. Then, steps ST1 to ST3 of the method MT1 described above were performed on the substrate using the plasma processing apparatus 1. In step ST1, the substrate was placed on the substrate support inside the chamber. In step ST2, a processing gas was supplied into the chamber, and the amorphous carbon film was etched using plasma generated from the processing gas. In step ST3, a processing gas including hydrogen fluoride gas and argon gas was supplied into the chamber. In step ST3, the pressure inside the chamber was 40 Pa (300 mTorr), the temperature of the substrate support was −60° C., and the duration of step ST3 was 10 seconds. No plasma was generated during step ST3. Through step ST3, the deposit adhering to the opening of the mask was removed.

2nd Experiment

In a 2nd experiment, the method MT1 was performed identically to the 1st experiment, except that the temperature of the substrate support in step ST3 was −40° C.

First Experimental Result

In the 1st experiment, the thickness of the mask and the dimension CD of the opening were measured from an image of the cross section of the substrate before performing step ST3. In the 1st and 2nd experiments, the thickness of the mask and the dimension CD of the opening were measured from an image of the cross section of the substrate after performing the method MT1.

In the 1st experiment, the thickness of the mask before performing step ST3 was 301.6 nm, and the thickness of the mask after performing the method MT1 was 294.3 nm. In the 2nd experiment, the thickness of the mask after performing the method MT1 was 298.3 nm. These results confirm that the decrease in thickness of the mask may be suppressed in the 1st and 2nd experiments.

In the 1st experiment, the opening dimension before performing step ST3 was nm, and the opening dimension after performing the method MT1 was 80.6 nm. In the 2nd experiment, the opening dimension after performing the method MT1 was nm. These results confirm that the opening dimension of the mask may be expanded in the 1st and 2nd experiments.

Figure 11:
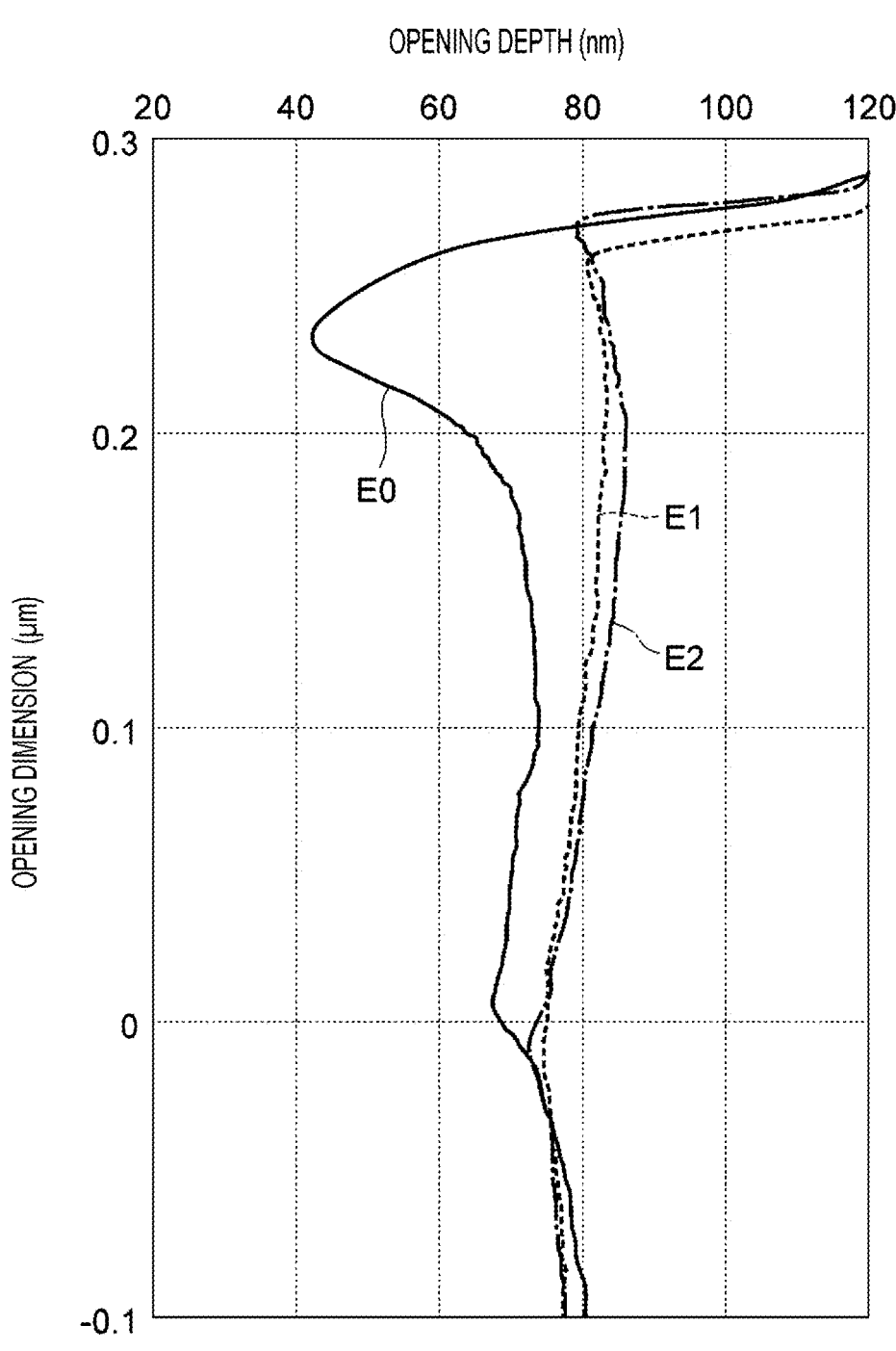
FIG. 11 is a graph representing an example of a relationship between an opening depth and an opening dimension.

Further, in the 1st experiment, the opening depth and the opening dimension of the mask were measured from an image of the cross section of the substrate before performing step ST3. FIG. 11 represents the results.

FIG. 11 is a graph representing an example of the relationship between the opening depth and the opening dimension. The vertical axis represents the opening depth ($\mu$m) of the mask. The position where the value of the vertical axis is 0 $\mu$m indicates the boundary position between the mask and the amorphous carbon film. The region where the value of the vertical axis is positive corresponds to the mask. The horizontal axis represents the opening dimension (nm) of the mask. In the graph, E0 indicates the result before performing step ST3 in the 1st experiment, E1 indicates the result after performing the method MT1 in the 1st experiment, and E2 indicates the result after performing the method MT1 in the 2nd experiment. As illustrated in FIG. 11, it may be identified that the opening dimension of the mask may be expanded while suppressing the decrease in thickness of the mask in the 1st and 2nd experiments.

3rd Experiment

In a 3rd experiment, the method MT1 was performed identically to the 1st experiment, except that the duration of step ST3 was 3 minutes. The temperature of the substrate support in step ST3 was −60° C.

4th Experiment

In a 4th experiment, the method MT1 was performed identically to the 3rd experiment, except that the temperature of the substrate support in step ST3 was −20° C.

5th Experiment

In a 5th experiment, the method MT1 was performed identically to the 3rd experiment, except that the temperature of the substrate support in step ST3 was 0° C.

Second Experimental Result

Similarly to the first experimental result, the thickness of the mask and the dimension CD of the opening were measured from an image of the cross section of the substrate after performing the method MT1 in the 3rd to 5th experiments.

In the 3rd experiment, the thickness of the mask after performing the method MT1 was 297.7 nm. In the 4th experiment, the thickness of the mask after performing the method MT1 was 304.3 nm. In the 5th experiment, the thickness of the mask after performing the method MT1 was 308.2 nm. These results confirm that the decrease in thickness of the mask may be suppressed or the thickness of the mask may be increased in the 3rd to 5th experiments.

In the 3rd experiment, the opening dimension after performing the method MT1 was 79.9 nm. In the 4th experiment, the opening dimension after performing the method MT1 was 81.5 nm. In the 5th experiment, the opening dimension after performing the method MT1 was 62.1 nm. These results confirm that the opening dimension of the mask may be expanded in the 3rd to 5th experiments.

Figure 12:
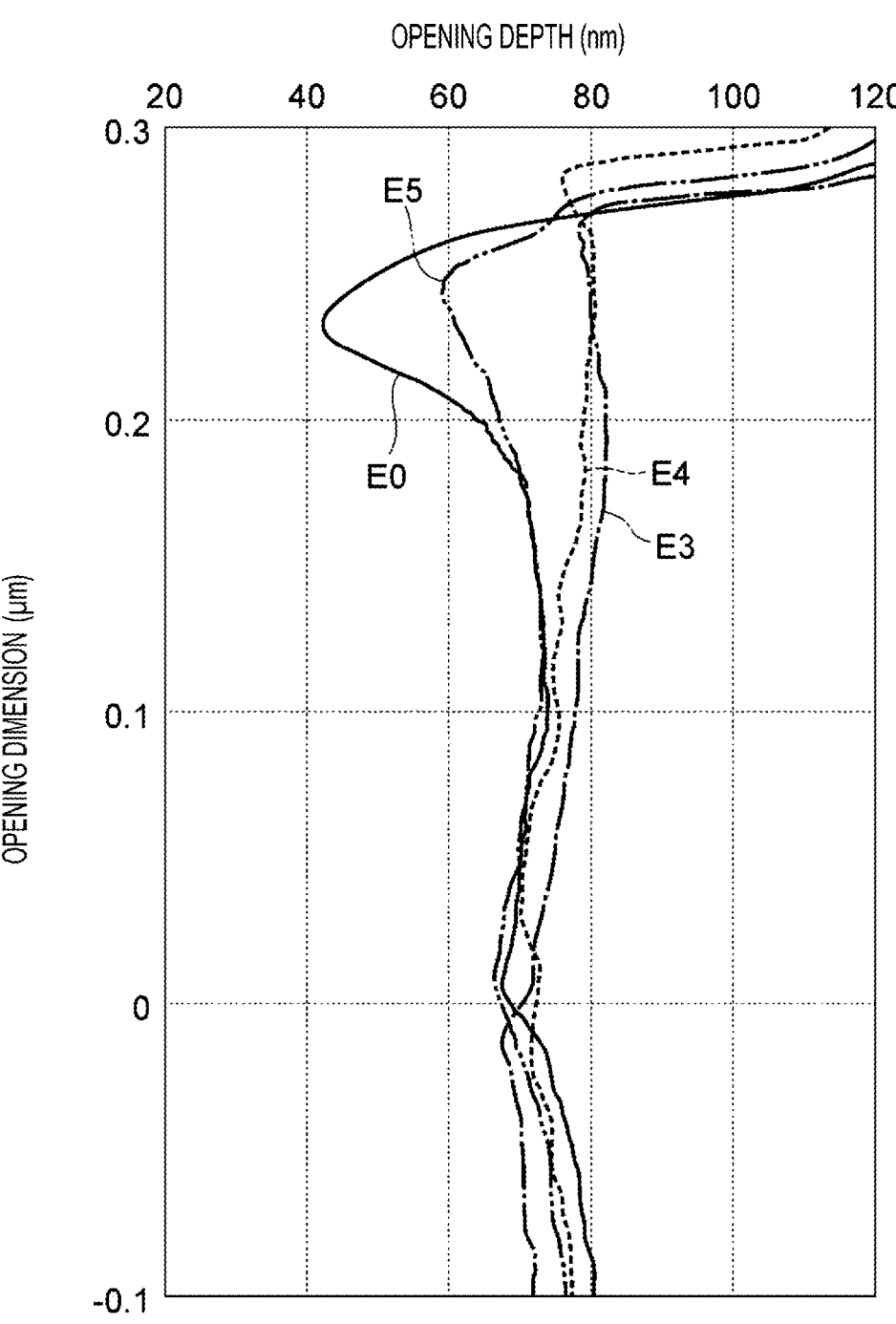
FIG. 12 is a graph representing an example of a relationship between an opening depth and an opening dimension.

Similarly to the first experimental result, the opening depth and the opening dimension of the mask were measured from an image of the cross section of the substrate after performing the method MT1 in the 3rd to 5th experiments. FIG. 12 represents the results.

FIG. 12 is a graph representing an example of the relationship between the opening depth and the opening dimension. The vertical and horizontal axes are the same as the vertical and horizontal axes in FIG. 11. In the graph, E3 indicates the result after performing the method MT1 in the 3rd experiment, E4 indicates the result after performing the method MT1 in the 4th experiment, and E5 indicates the result after performing the method MT1 in the 5th experiment. As illustrated in FIG. 12, it may be identified that the opening dimension of the mask may be expanded while suppressing the decrease in thickness of the mask or increasing the thickness of the mask in the 3rd to 5th experiments. It may also be identified that the opening dimension of the mask expands when the temperature of the substrate support is lowered in step ST3.

6th Experiment

In a 6th experiment, the method MT1 was performed identically to the 5th experiment, except that the pressure in the chamber during step ST3 was set to 53.3 Pa (400 mTorr). The temperature of the substrate support during step ST3 was 0° C.

Third Experimental Result

Similarly to the first experimental result, the thickness of the mask and the dimension CD of the opening were measured from an image of the cross section of the substrate after performing the method MT1 in the 6th experiment.

In the 6th experiment, the thickness of the mask after performing the method MT1 was 304.3 nm. This result confirms that the thickness of the mask may be increased in the 6th experiment.

In the 6th experiment, the opening dimension after performing the method MT1 was 75.8 nm. This result confirms that the opening dimension of the mask may be expanded in the 6th experiment.

Figure 13:
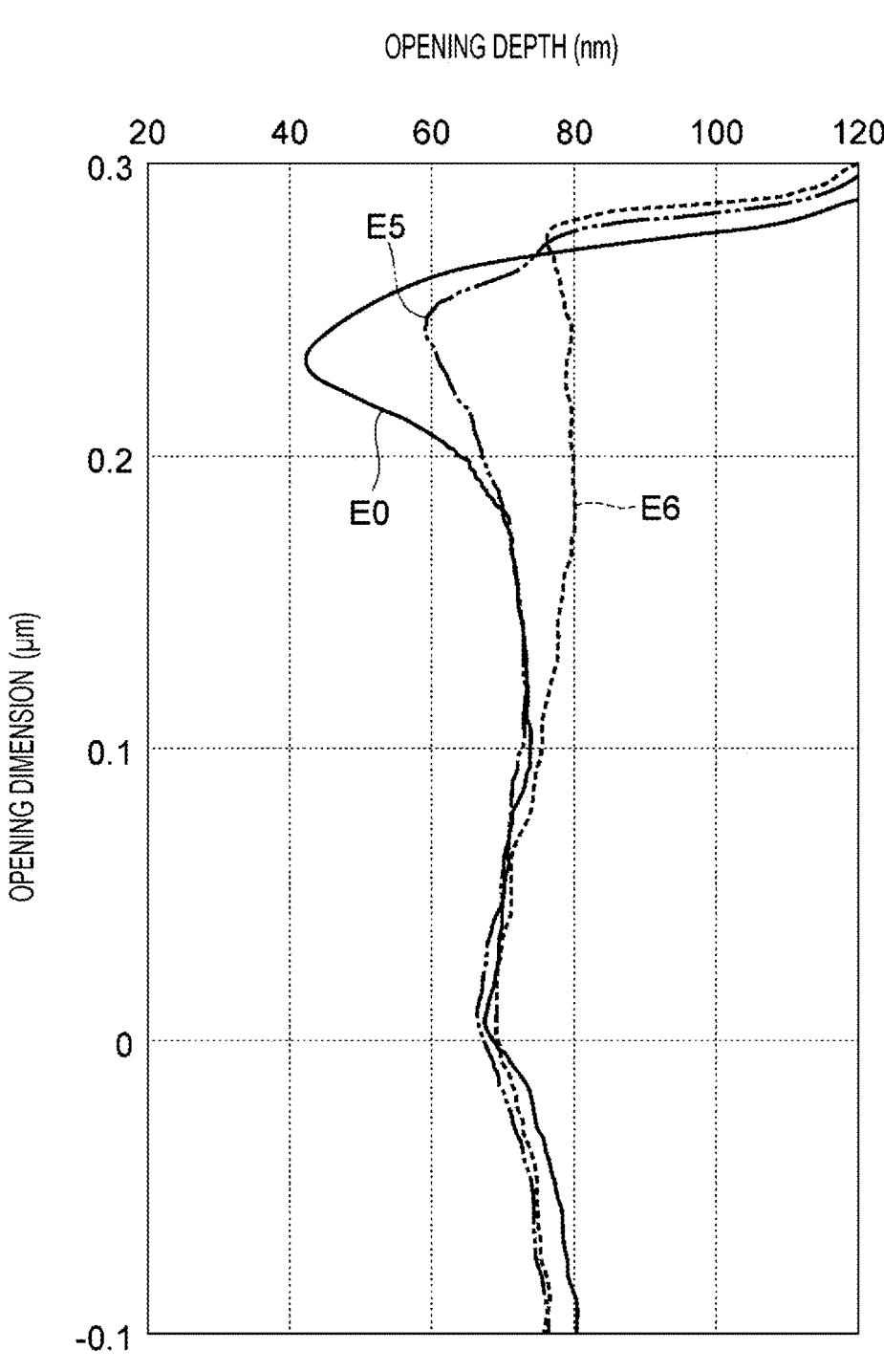
FIG. 13 is a graph representing an example of a relationship between an opening depth and an opening dimension.

Further, similarly to the first experimental result, the opening depth and the opening dimension of the mask were measured from an image of the cross section of the substrate after performing the method MT1 in the 6th experiment. FIG. 13 represents the results.

FIG. 13 is a graph representing an example of the relationship between the opening depth and the opening dimension. The vertical and horizontal axes are the same as the vertical and horizontal axes in FIG. 11. In the graph, E6 indicates the result after performing the method MT1 in the 6th experiment. As illustrated in FIG. 13, it may be identified that the opening dimension of the mask may be expanded while increasing the thickness of the mask in the 6th experiment. It may also be identified that the opening dimension of the mask is expanded when the pressure inside the chamber is increased in step ST3.

7th Experiment

In a 7th experiment, the method MT1 was performed identically to the 5th experiment, except that the pressure inside the chamber during step ST3 was set to 66.7 Pa (500 mTorr), and the temperature of the substrate support during step ST3 was set to ° C.

8th Experiment

In an 8th experiment, the method MT1 was performed identically to the 5th experiment, except that the pressure in the chamber during step ST3 was set to 107 Pa (800 mTorr), and the temperature of the substrate support during step ST3 was set to 20° C.

Fourth Experimental Result

Similarly to the first experimental result, the thickness of the mask and the dimension CD of the opening were measured from an image of the cross section of the substrate after performing the method MT1 in the 7th experiment.

In the 7th experiment, the thickness of the mask after performing the method MT1 was 302.9 nm. This result confirms that the thickness of the mask may be increased in the 7th experiment.

In the 7th experiment, the opening dimension after performing the method MT1 was 70.1 nm. This result confirms that the opening dimension of the mask may be expanded in the 7th experiment.

In the 8th experiment, the opening dimension after performing the method MT1 was 78.8 nm. This result confirms that the opening dimension of the mask may be expanded in the 8th experiment.

Figure 14:
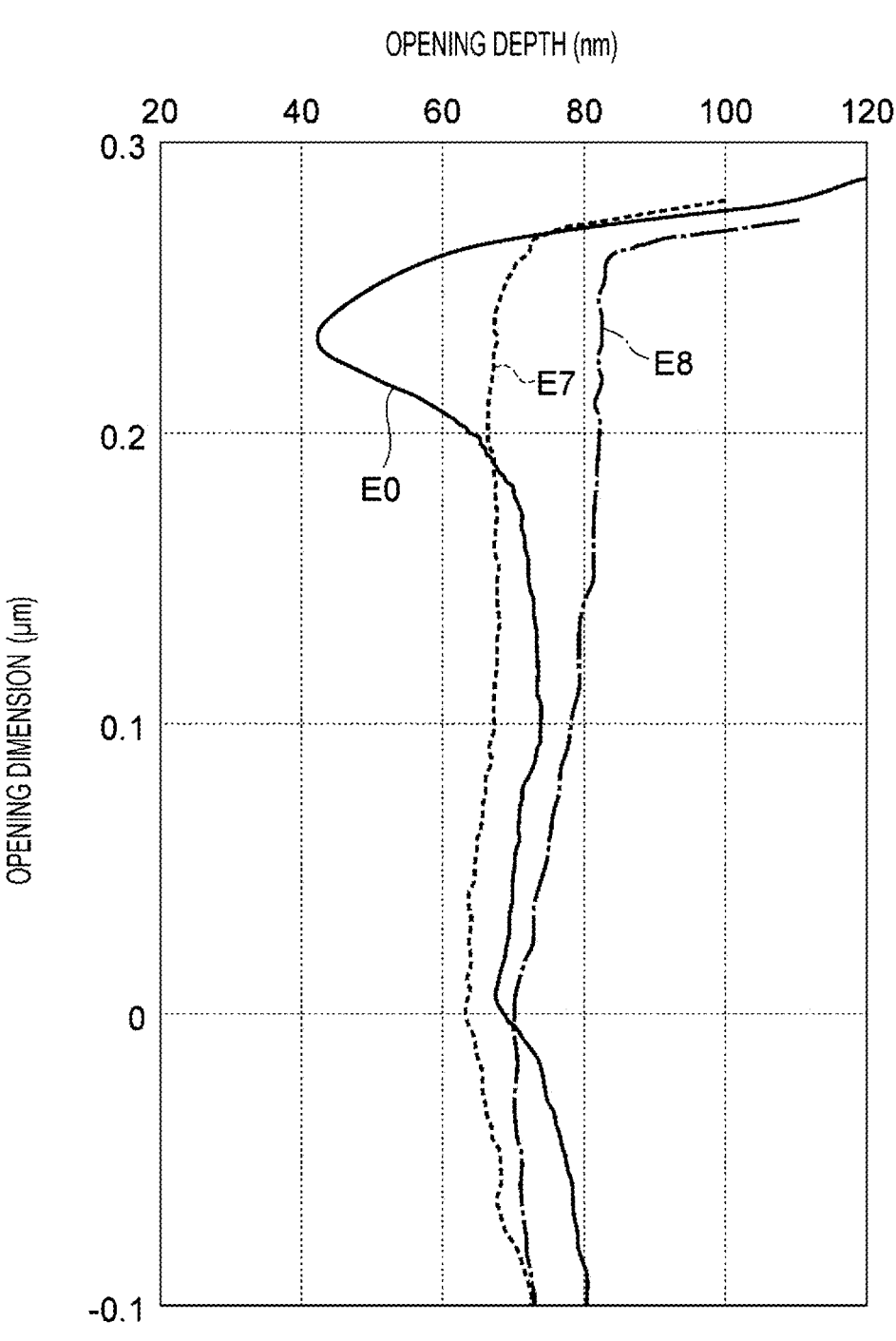
FIG. 14 is a graph representing an example of a relationship between an opening depth and an opening dimension.

Further, similarly to the first experimental result, the opening depth and the opening dimension of the mask were measured from an image of the cross section of the substrate after performing the method MT1 in the 7th and 8th experiments. FIG. 14 represents the results.

FIG. 14 is a graph representing an example of the relationship between the opening depth and the opening dimension. The vertical and horizontal axes are the same as the vertical and horizontal axes in FIG. 11. In the graph, E7 indicates the result after performing the method MT1 in the 7th experiment, and E8 indicates the result after performing the method MT1 in the 8th experiment. As illustrated in FIG. 14, it may be identified that the opening dimension of the mask may be expanded while increasing the thickness of the mask in the 7th and 8th experiments. It may also be identified that the opening dimension of the mask may be expanded by increasing the pressure in the chamber during step ST3, even though the temperature of the substrate support during step ST3 is raised.

Figure 15:
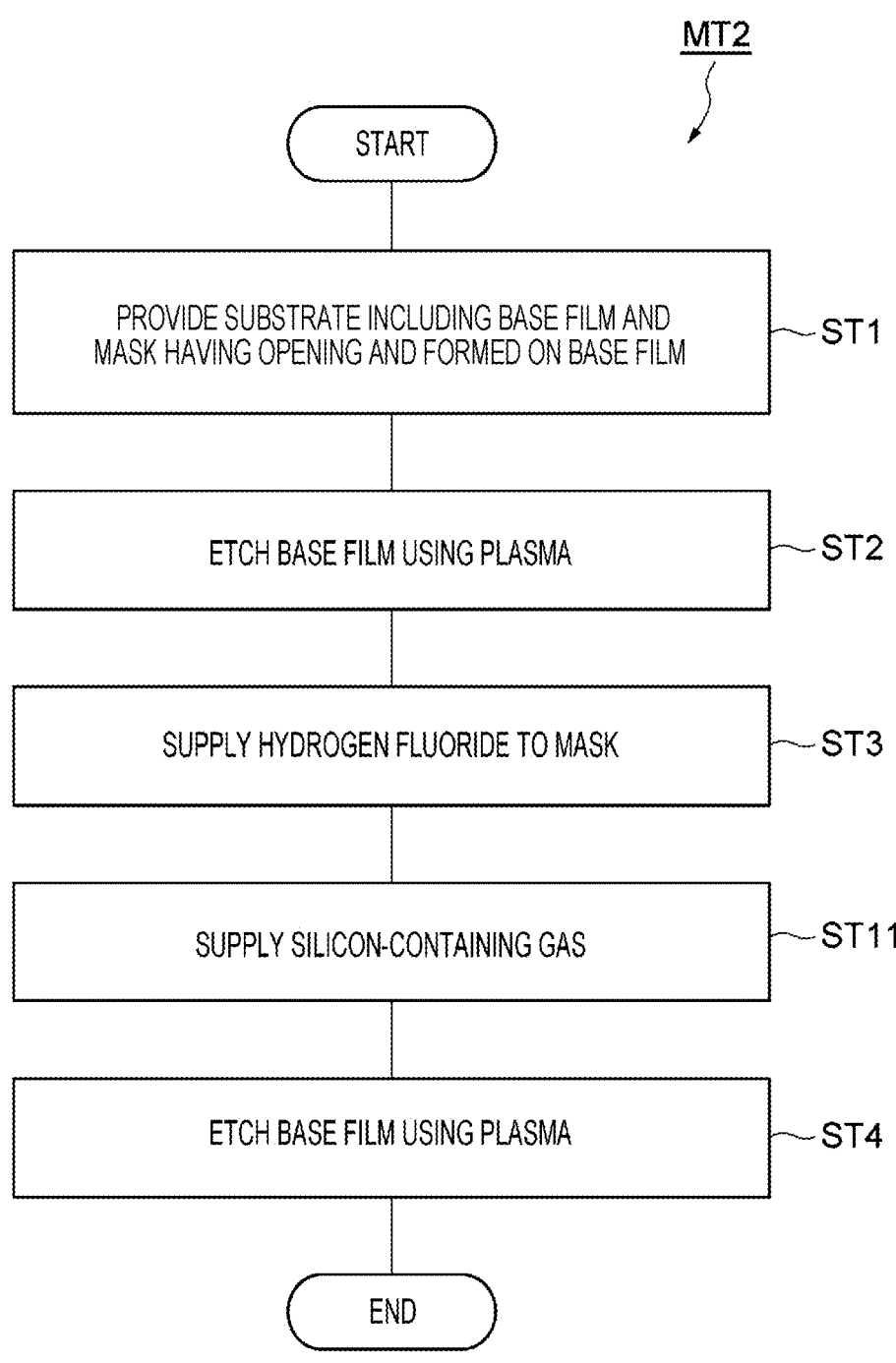
FIG. 15 is a flowchart of an etching method according to an embodiment.
Figure 16:
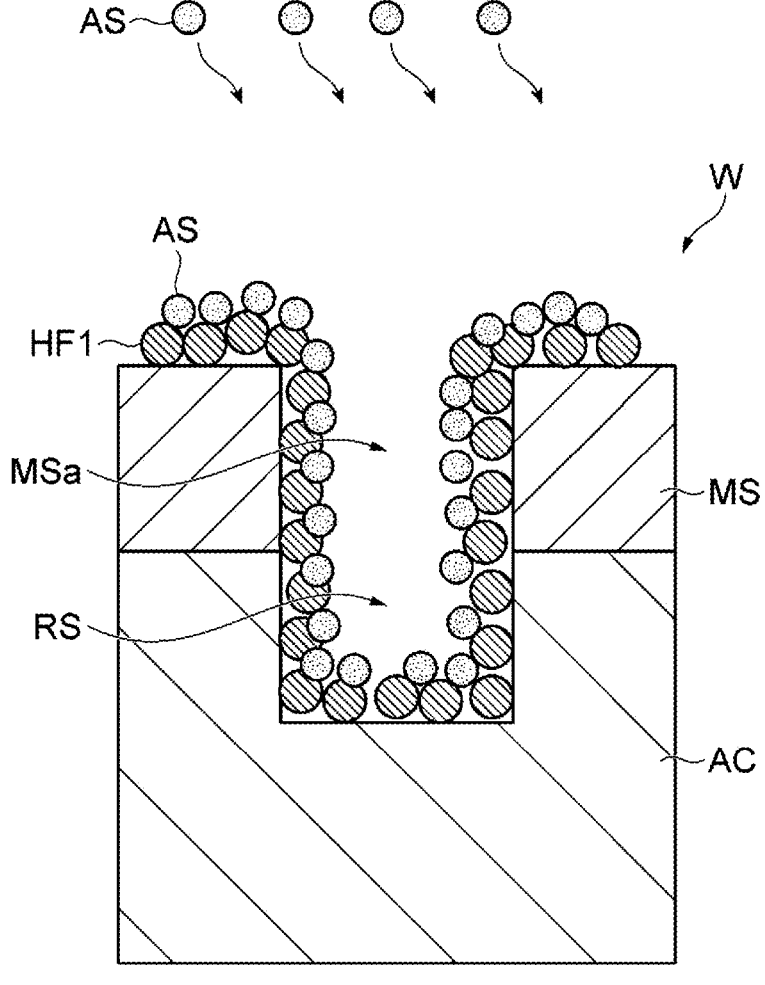
FIG. 16 is a cross-sectional view illustrating a step of an etching method according to an embodiment.
Figure 17:
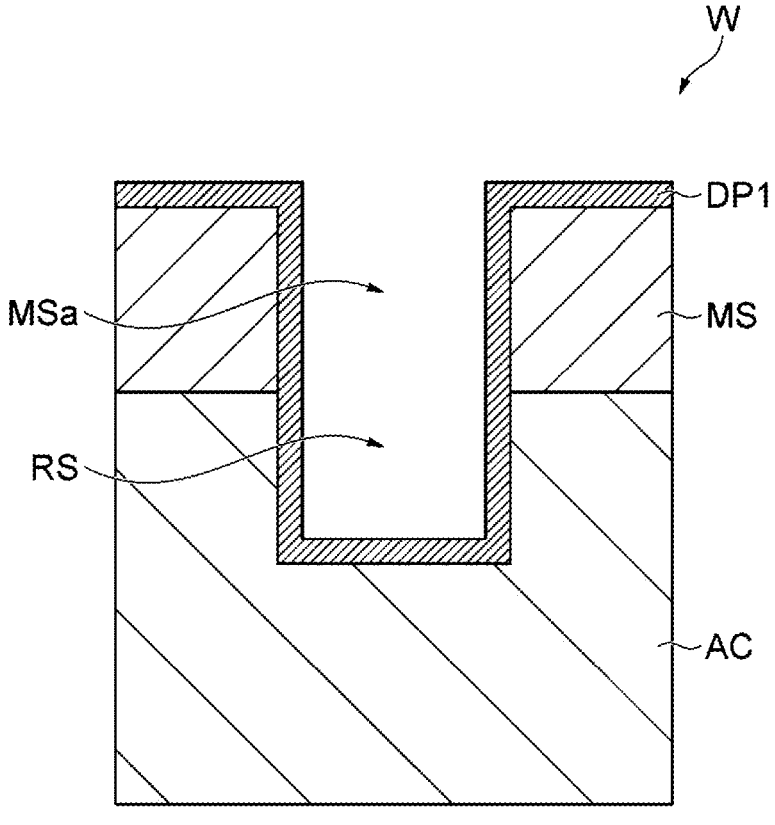
FIG. 17 is a cross-sectional view illustrating a step of an etching method according to an embodiment.

FIG. 15 is a flowchart of an etching method according to an embodiment. An etching method MT2 illustrated in FIG. 15 (hereinafter, referred to as a "method MT2") may be performed by the plasma processing apparatus 1 of the embodiment described above. The method MT2 may be applied to the substrate W of FIG. 4. The method MT2 may be performed identically to the method MT1, except for the points described below. FIGS. 16 and 17 are each a cross-sectional view of a step of an etching method according to an embodiment.

As illustrated in FIG. 15, the method MT2 includes step ST11, in addition to steps ST1 to ST4. Step ST11 may be performed between steps ST3 and ST4. Step ST11 may be performed in the same chamber as that of the other steps ST1 to ST4, or in a different chamber from that of the other steps ST1 to ST4.

(Step ST11)

In step ST11, a silicon-containing gas is supplied to the substrate W as illustrated in FIGS. 16 and 17. Step ST11 may be performed in a state where the hydrogen fluoride molecules HF1 are adsorbed to the substrate W. In an embodiment, a third processing gas that includes a silicon-containing gas is supplied into the plasma processing chamber 10. The third processing gas may not include hydrogen fluoride. That is, the supply of hydrogen fluoride may be stopped at the time when step ST3 is completed. In an example, aminosilane molecules AS in the silicon-containing gas react with the hydrogen fluoride molecules HF1 on the substrate W, so that the deposit DP1 is formed on the substrate W as illustrated in FIG. 17. In an embodiment, the third processing gas that includes the silicon-containing gas is supplied without generating plasma. In this case, a damage to the substrate W by plasma may be suppressed. In another embodiment, plasma may be generated from the third processing gas that includes the silicon-containing gas. When plasma is generated, the source radio-frequency power may be equal to or less than 2,000 W, and the bias power supplied to the substrate support 11 may be 0 W.

In step ST3 illustrated in FIG. 6, the hydrogen fluoride molecules HF1 may be adsorbed to the bottom and the side wall of the recess RS (the surface of the base film AC), in addition to the surface of the mask MS (the top surface of the mask MS and the side wall of the mask MS that defines the opening MSa). In this case, the deposit DP1 is also formed on the bottom and the side wall of the recess RS, in addition to the surface of the mask MS, in step ST11. The thickness of the deposit DP1 may be 10 nm or more, or 20 nm or more. The thickness of the deposit DP1 may be 50 nm or less, or 30 nm or less.

The example of the pressure in step ST11 may be the same as the example of the pressure in step ST3. After step ST11 is completed, the pressure may be lower than the pressure in step ST11. Accordingly, the plasma processing chamber 10 is exhausted.

The duration of step ST11 may be the same as or different from the duration of step ST3.

After step ST11, steps ST3 and ST11 may be repeated. A purging may be performed between steps ST3 and ST11.

The silicon-containing gas may include silicon chloride gas. Examples of the silicon chloride gas include $SiCl_4$ gas. Alternatively, the silicon-containing gas may include nitrogen. The silicon-containing gas may include a hydrocarbon group. The silicon-containing gas may include an amino group. The amino group may be substituted. The amino group is represented as, for example, —$NR^1R^2$. $R^1$ and $R^2$ each represents hydrogen or hydrocarbon. The hydrocarbon may include nitrogen atoms, oxygen atoms, and halogen atoms. The silicon-containing gas may include aminosilane gas. It is easy to handle the aminosilane gas due to its relatively low reactivity. The silicon-containing gas may include aminosilane gas with one to four amino groups. The silicon-containing gas may include at least one typical element of hydrogen (H), boron (B), carbon (C), oxygen (O), nitrogen (N), phosphorus (P), and sulfur (S). The typical element may be included in the hydrocarbon of the amino group. The silicon-containing gas may include aminosilane gas containing carbon.

FIGS. 18A to 18D are each a view illustrating an example of the structural formula of aminosilane. In FIGS. 18A to 18D, $R^1$ to $R^8$ and $R^a$ to $R^c$ each represents hydrogen or hydrocarbon. The hydrocarbon may include nitrogen atoms, oxygen atoms, and halogen atoms. FIG. 18A illustrates aminosilane having one amino group. FIG. 18B illustrates aminosilane having two amino groups. FIG. 18C illustrates aminosilane having three amino groups. FIG. 18D illustrates aminosilane having four amino groups.

Examples of aminosilane include butyl aminosilane (BAS), bis-tertiarybutyl aminosilane (BTBAS), dimethyl aminosilane (DMAS), bis-dimethyl aminosilane (BDMAS), tridimethyl aminosilane (TDMAS), diethyl aminosilane (DEAS), bis-diethylaminosilane (BDEAS), dipropylaminosilane (DPAS), diisopropylaminosilane (DIPAS), hexakisethylaminodisilane, formula (1) of $((R1R2)N)_nSi_X$ $H_{2x+2-n-m}(R3)_m$, and formula (2) of $((R1R2)N)_nSi_XH_{2x-n-m}$ $(R3)_m$.

In the formulas (1) and (2) above, "n" is the number of amino groups, and is a natural number of 1 to 6. The "m" is the number of alkyl groups, and is 0 or a natural number of 1 to 5. R1, R2, or R3 is $CH_3$, $C_2H_5$, or $C_3H_7$. R1, R2, and R3 may or may not be the same. R3 may be Cl or F. X is a natural number equal to or more than 1.

The third processing gas that includes the silicon-containing gas may further include at least one selected from the group consisting of hydrogen gas, $SiH_4$ gas, $Si_2H_6$ gas, $BH_3$ gas, and $B_2H_6$ gas. These gases may be supplied at a different timing from the silicon-containing gas.

The third processing gas in step ST11 may further include silane gas that includes no amino group, in addition to the aminosilane gas. Examples of a higher-order silane-based gas, which has an order equal to or higher than disilane and includes no amino group, include a hydride of silicon represented by the formula of $Si_mH_{2m+2}$ (where "m" is a natural number of 2 or more) and a hydride of silicon represented by the formula of $Si_nH_{2n}$ (where "n" is a natural number of 3 or more).

Examples of the hydride of silicon represented by the formula of $Si_mH_{2m+2}$ above include disilane ($Si_2H_6$), trisilane ($Si_3H_8$), tetrasilane ($Si_4H_{10}$), pentasilane ($Si_5H_{12}$), hexasilane ($Si_6H_1$), and heptasilane ($Si_7H_{16}$).

Examples of the hydride of silicon represented by the formula of $Si_nH_{2n}$ above include cyclotrisilane ($Si_3H_6$), cyclotetrasilane ($Si_4H_8$), cyclopentasilane ($Si_5H_{10}$), cyclohexasilane ($Si_6H_{12}$), and cycloheptasilane ($Si_7H_{14}$).

The third processing gas in step ST11 may further include an inert gas. Examples of the inert gas include a noble gas.

The deposit DP1 may contain at least one element selected from the group consisting of nitrogen, fluorine, carbon, hydrogen, oxygen, and silicon. The composition ratio of carbon contained in the deposit DP1 may be the largest, or may be larger than 50 atomic %. The composition ratios of the elements may be measured by an X-ray electron spectroscopy (XPS).

In step ST11, hydrogen fluoride may be further supplied to the substrate W. In an embodiment, the third processing gas that includes a silicon-containing gas and hydrogen fluoride gas is supplied into the plasma processing chamber 10. Hydrogen fluoride may be continuously supplied from step ST3 until step ST11. The partial pressure of the hydrogen fluoride gas in step ST11 may be the same or different from the partial pressure of the hydrogen fluoride gas in step ST3.

According to the method MT2 above, the deposit DP1 may be formed on the substrate W in step ST11. When the deposit DP1 is formed on the side wall of the recess RS, the etching of the side wall of the recess RS may be suppressed in step ST4.

Figure 19:
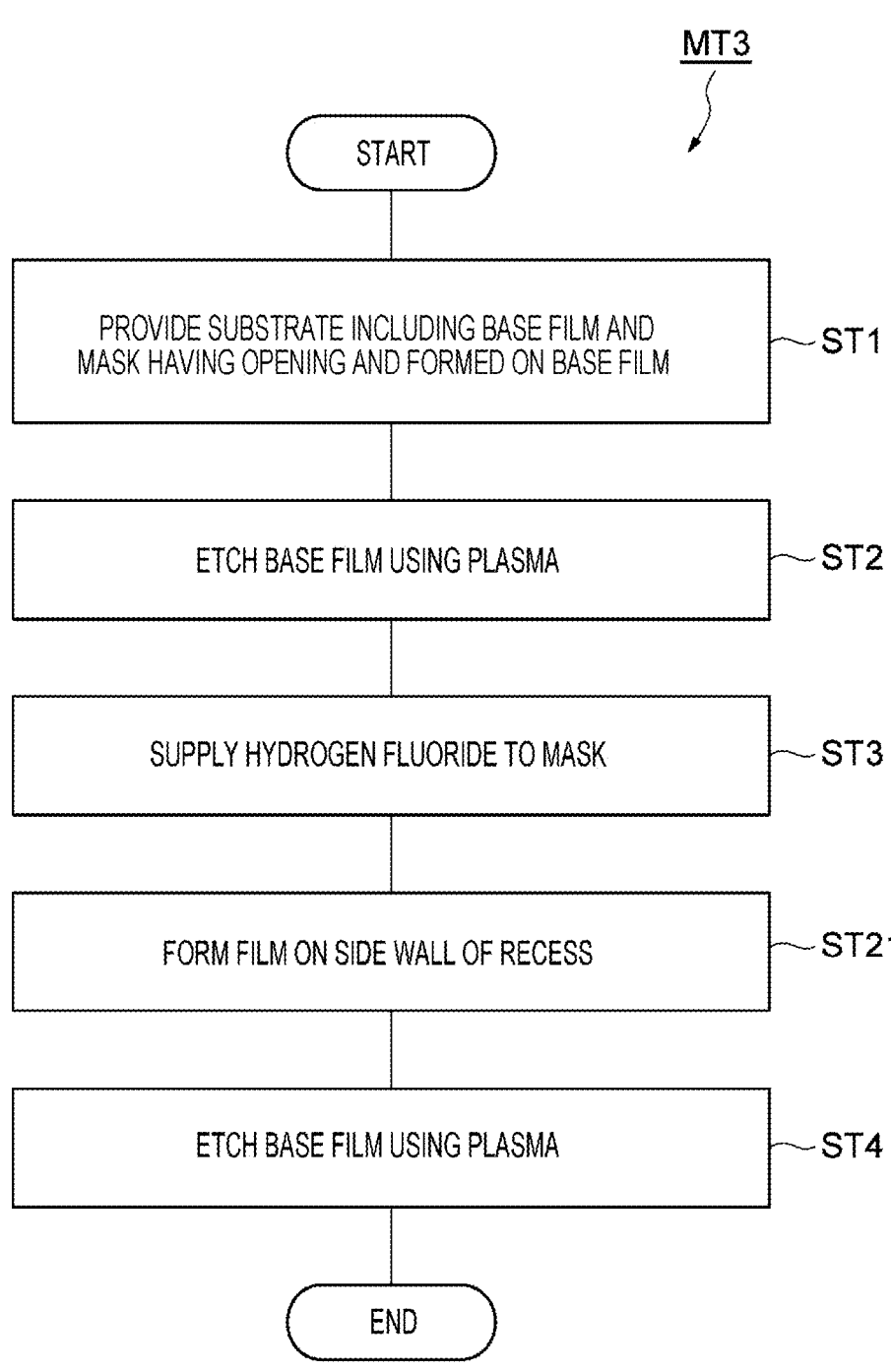
FIG. 19 is a flowchart of an etching method according to an embodiment.
Figure 20:
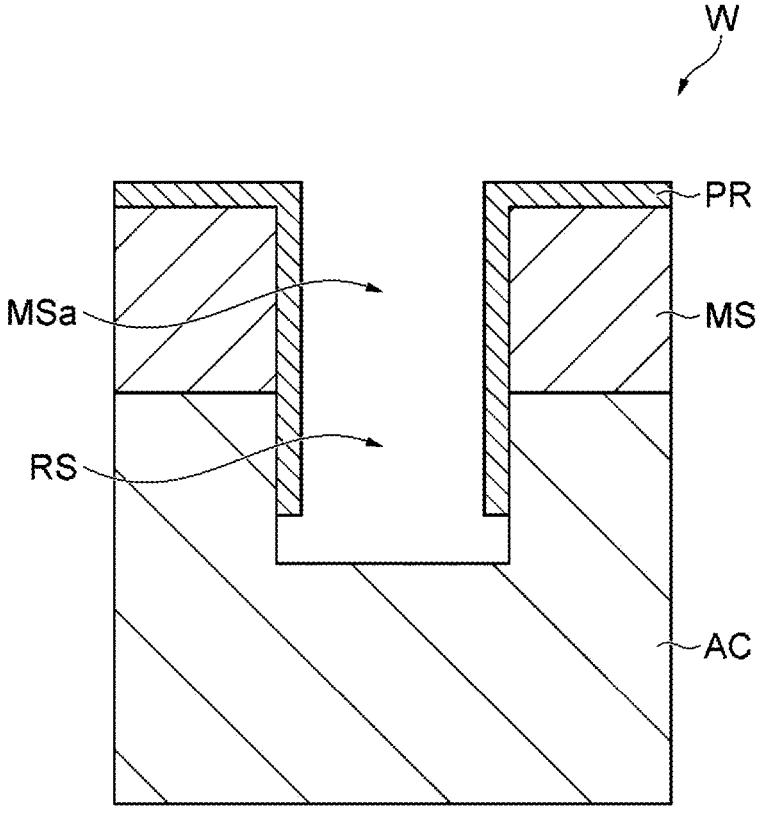
FIG. 20 is a cross-sectional view illustrating a step of an etching method according to an embodiment.

FIG. 19 is a flowchart of an etching method according to an embodiment. An etching method MT3 illustrated in FIG. 19 (hereinafter, referred to as a "method MT3") may be performed by the plasma processing apparatus 1 of the embodiment described above. The method MT3 may be applied to the substrate W of FIG. 4. The method MT5 may be performed identically to the method MT1, except for the points described below. FIG. 20 is a cross-sectional view illustrating a step of an etching method according to an embodiment.

As illustrated in FIG. 19, the method MT3 includes step ST21, in addition to steps ST1 to ST4. Step ST21 may be performed between steps ST3 and ST4. Step ST21 may be performed in the same chamber as that of the other steps ST1 to ST4, or in a different chamber from that of the other steps ST1 to ST4.

(Step ST21)

In step ST21, a film PR is formed on the side wall of the recess RS formed by etching the base film AC, as illustrated in FIG. 20. The film PR is formed on the upper portion of the side wall of the recess RS, and may not be formed on the lower portion of the side wall of the recess RS. The film PR may be formed on the surface of the mask MS. The film PR may or may not be formed on the bottom of the recess RS. The film PR may be formed by an atomic layer deposition (ALD) method, an unsaturated ALD method, a molecular layer deposition (MLD) method, or a chemical vapor deposition (CVD) method. The film PR may be a silicon-containing film, a carbon-containing film, or a metal-containing film.

In the unsaturated ALD method, a cycle including first to fourth steps is repeated as performed in the ALD method. In the first step, a first gas (precursor gas) is supplied to the substrate W. In the second step, the chamber, in which the substrate W is accommodated, is purged. In the third step, a second gas (reactive gas) is supplied to the substrate W. In the third step, plasma may be generated from the second gas. In the fourth step, the chamber, in which the substrate W is accommodated, is purged. When the film PR is a silicon oxide film, the first gas includes, for example, an aminosilane-based gas, $SiCl_4$ gas, or $SiF_4$ gas, and the second gas includes, for example, an oxygen-containing gas such as $O_2$ gas. When the film PR is a carbon-containing film, the first gas includes, for example, an organic compound gas. The organic compound gas includes, for example, epoxide, carboxylic acid, carboxylic acid halide, anhydrous carboxylic acid, isocyanate, and phenols. When the film PR is a carbon-containing film, the second gas includes, for example, an inorganic compound gas having N—H bonds, an inert gas, water vapor ($H_2O$ gas), a mixed gas of nitrogen gas and hydrogen gas, and a mixed gas of hydrogen gas and oxygen gas.

The unsaturated ALD method is performed by either a first method or a second method. In the first method, the precursor included in the first gas is adsorbed to the entire surface of the substrate W during the first step, and the supply of the second gas is controlled during the third process such that the second gas is not applied to the entire surface of the substrate W. That is, the first method uses the local reaction. In the second method, the precursor is adsorbed to only a portion of the surface of the substrate W during the first step, and the second gas is supplied to the entire surface of the substrate W during the third step. That is, the second method uses the local adsorption of the precursor. The local reaction and the local adsorption are performed by controlling one or more of, for example, the temperature of the substrate support supporting the substrate W, the pressure in the chamber, the flow rate and the supply time of the first gas (precursor gas), the flow rate and the supply time of the second gas (reactive gas), and the process time. When the unsaturated ALD method uses plasma, the power level of the radio-frequency power supplied for generating plasma may be adjusted.

In the ALD method, the film PR is conformally formed on the surface of the substrate W. The film PR is, for example, a tungsten-containing film, a tin-containing film, an aluminum-containing film, or a hafnium-containing film. In the ALD method, a cycle including first to fourth steps is repeated. In the first step, a first gas (precursor gas) is supplied to the substrate W. In the second step, the chamber, in which the substrate W is accommodated, is purged. In the third step, a second gas (reactive gas) is supplied to the substrate W. In the fourth step, the chamber, in which the substrate W is accommodated, is purged.

In the CVD method, the film PR is formed on the substrate W by plasma generated from a processing gas.

Step ST21 may be performed after step ST3 is completed and after the pressure becomes lower than the pressure of step ST3. Accordingly, step ST21 may be performed in a state where the hydrogen fluoride molecules HF1 adsorbed to the substrate W in step ST3 are removed.

According to the method MT3 above, the film PR may be formed on the side wall of the recess RS in step ST21. Therefore, the etching of the side wall of the recess RS may be suppressed in step ST4. When the film PR is formed by the unsaturated ALD method, the thickness of the film PR that may be formed on the bottom of the recess RS may be reduced. Therefore, the etching of the bottom of the recess RS may be accelerated in step ST4.

Step ST21 may be performed after the etching of the base film AC in step ST2, and the base film AC may be etched again after step ST21 is performed. In this case, when the base film AC is etched after step ST21, the etching of the side wall of the recess RS may be suppressed by the film PR formed on the side wall of the recess RS.

Hereinafter, various experiments conducted for evaluating the method MT3 will be described. The experiments described below are not intended to limit the present disclosure.

9th Experiment

In a 9th experiment, a substrate having an amorphous carbon film and a mask formed on the amorphous carbon film was prepared. Then, steps ST1 to ST3, ST21, and ST4 of the method MT3 described above were sequentially performed on the substrate by using the plasma processing apparatus 1. In step ST1, the substrate was placed on the substrate support in the chamber. In step ST2, a processing gas was first supplied into the chamber, and the amorphous carbon film was etched using plasma generated from the processing gas to form a recess. Next, a processing gas that includes $SiCl_4$ gas and argon gas was supplied into the chamber, and a first protective film was formed on the side wall of the recess by using plasma generated from the processing gas. Next, a processing gas was supplied into the chamber, and the bottom of the recess was etched using plasma generated from the processing gas. In step ST3, a processing gas that includes hydrogen fluoride gas and argon gas was supplied into the chamber. In step ST3, a pressure in the chamber was 127 Pa (950 mTorr), the temperature of the substrate support was 0° C., and the duration of step ST3 was 10 seconds. No plasma was generated in step ST3. The deposit adhering to the opening of the mask was removed through step ST3. In step ST21, a processing gas that includes $SiCl_4$ gas and argon gas was supplied into the chamber, and a second protective film was formed on the side wall of the recess by using plasma generated from the processing gas. In step ST4, a processing gas was supplied into the chamber, and the bottom of the recess was etched by using plasma generated from the processing gas.

10th Experiment

A 10th experiment was conducted identically to the 9th experiment, except that step ST21 was not performed.

11th Experiment

An 11th experiment was conducted identically to the 10th experiment, except that the following step was performed instead of step ST3. A processing gas, which includes nitrogen fluoride gas, hydrofluorocarbon gas, nitrogen gas, and argon gas, was supplied into the chamber, and the deposit adhering to the opening of the mask was removed using plasma generated from the processing gas.

Fifth Experimental Result

Figure 21:
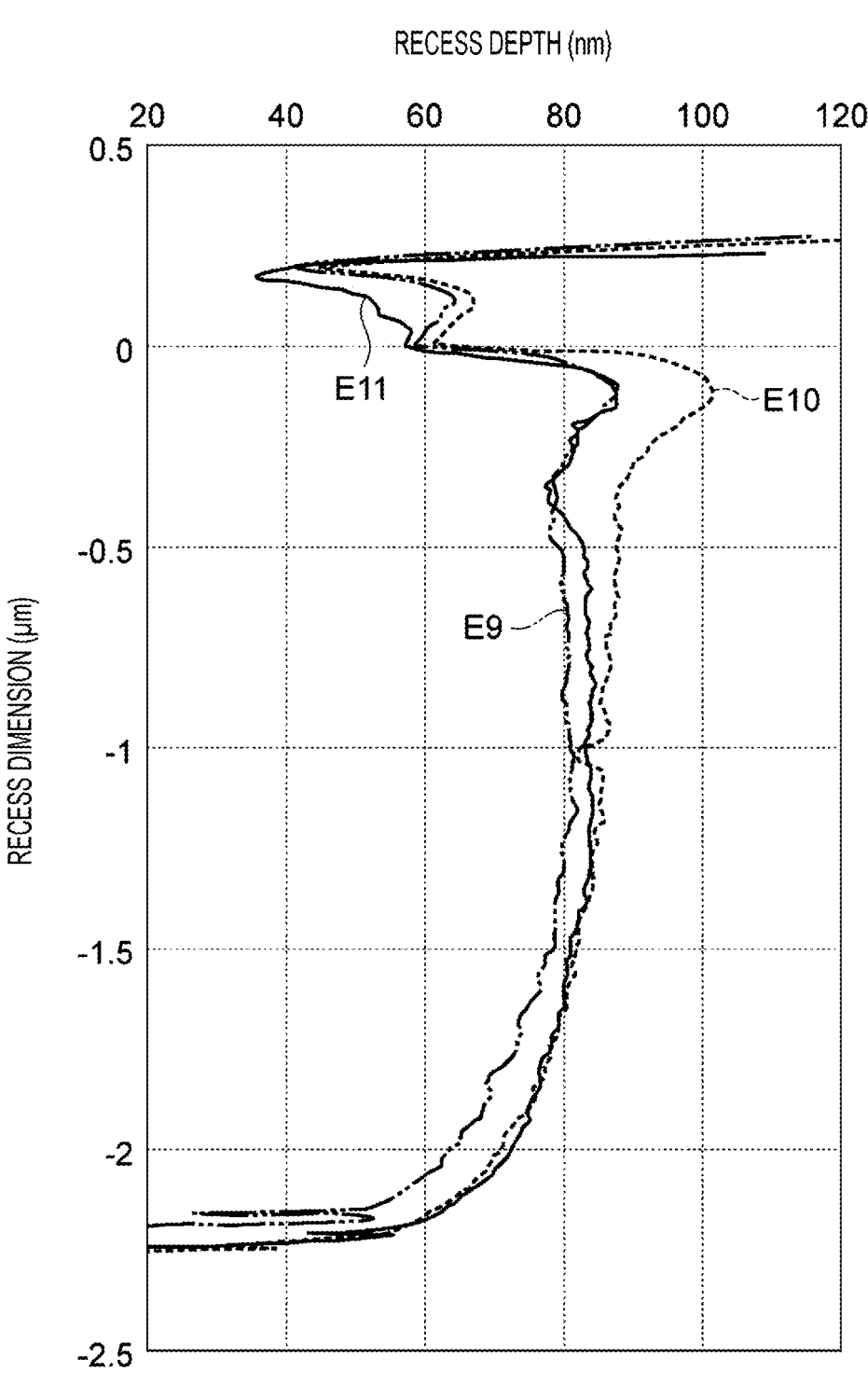
FIG. 21 is a graph representing an example of a relationship between a depth and a dimension of a recess.

In the 9th to 11th experiments, the depth and the dimension CD of the recess formed in the base film were measured from an image of the cross section of the substrate after performing the method MT3. FIG. 21 represents the results.

FIG. 21 is a graph representing an example of the relationship between the depth and the dimension of the recess. The vertical axis represents the depth (μm) of the recess. The position where the value of the vertical axis is 0 μm is the boundary position between the mask and the amorphous carbon film. The region where the value of the vertical axis is positive corresponds to the mask. The horizontal axis represents the dimension (nm) of the recess. In the graph, E9 indicates the result after performing the method MT3 in the 9th experiment. E10 indicates the result after performing the method MT3 in the 10th experiment. E11 indicates the result after performing the method MT3 in the 11th experiment. As illustrated in FIG. 21, in the 9th experiment, the maximum value of the dimension of the recess (bowing) may be made smaller than that in the 10th experiment. Therefore, it may be identified that by forming the second protective film on the side wall of the recess through step ST21, the etching of the side wall of the recess in step ST4 may be suppressed. As illustrated in FIG. 21, in the 9th experiment, the maximum value of the dimension of the recess (bowing) may be made as small as that in the 11th experiment.

Immediately after the deposit adhering to the opening of the mask was removed (immediately after step ST3), the bowing in the 10th experiment was equal to that in the 11th experiment. This represents that a large bowing is formed by the etching in the 10th experiment. Further, in the 10th and 11th experiments, an image of the cross-section of the substrate was observed immediately after the deposit adhering to the opening of the mask was removed. In the 11th experiment, striations were observed on the side wall of the recess. Meanwhile, in the 10th experiment, no striations were observed on the side wall of the recess. The striations are formed when the protective film on the side wall is scraped due to the collision of ions. The presence of striations represents the presence of the protective film. Thus, it may be identified that in the 10th experiment, the first protective film is removed by removing the deposit adhering to the opening of the mask. Meanwhile, it may be identified that in the 11th experiment, the first protective film is not removed even when the deposit adhering to the opening of the mask is removed.

Figure 22:
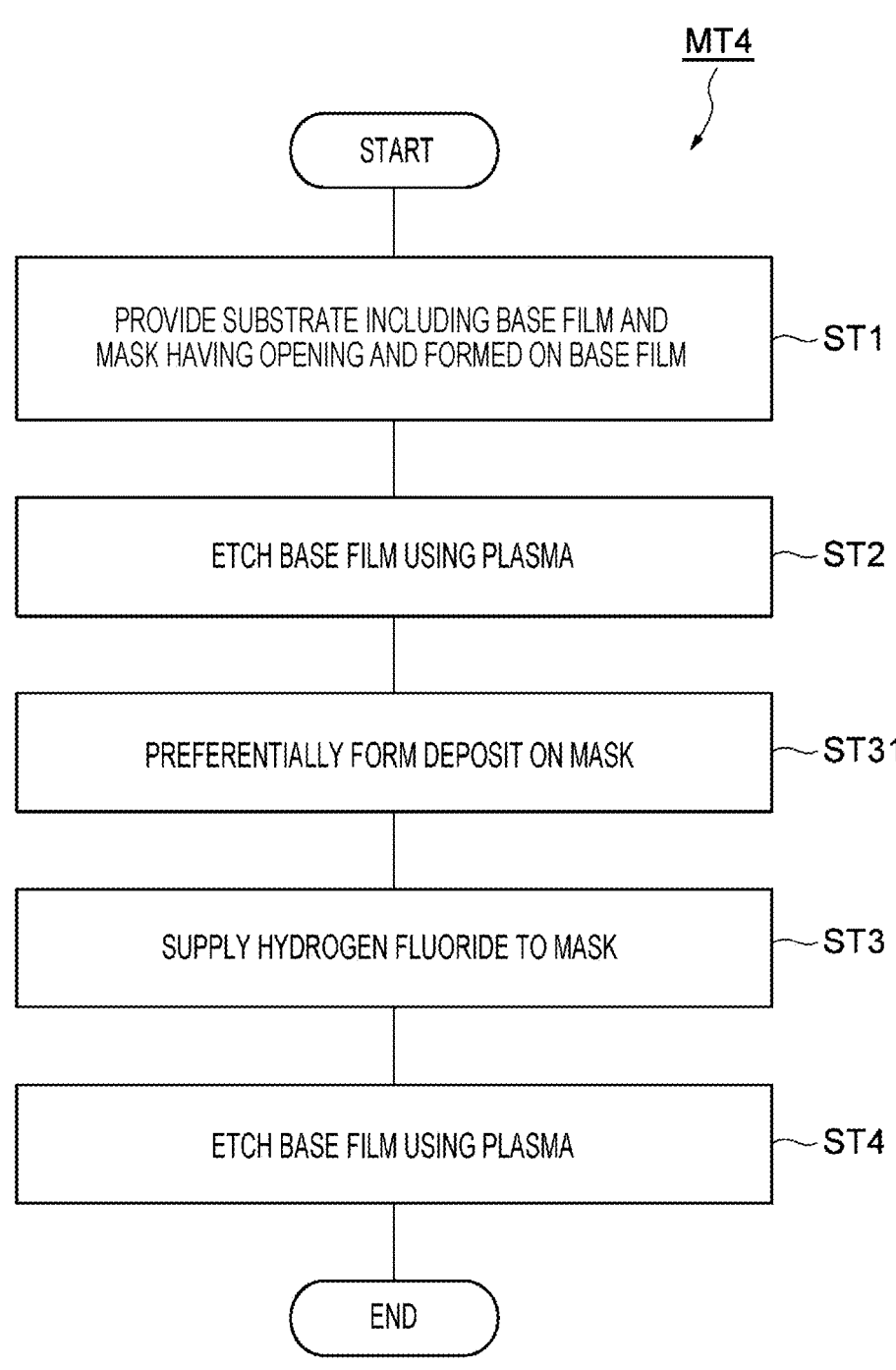
FIG. 22 is a flowchart of an etching method according to an embodiment.

FIG. 22 is a flowchart of an etching method according to an embodiment. An etching method MT4 illustrated in FIG. 22 (hereinafter, referred to as a "method MT4") may be performed by the plasma processing apparatus 1 of the embodiment described above. The method MT4 may be applied to the substrate W of FIG. 4. The method MT4 may be performed identically to the method MT1, except for the points described below. FIGS. 23 and 24A to 24D are each a cross-sectional view illustrating a step of an etching method according to an embodiment.

As illustrated in FIG. 22, the method MT4 includes step ST31, in addition to steps ST1 to ST4. Step ST31 may be performed between steps ST2 and ST3. Step ST31 may be performed in the same chamber as that of the other steps ST1 to ST4 or in a different chamber from that of the other steps ST1 to ST4.

(Step ST31)

Figure 23:
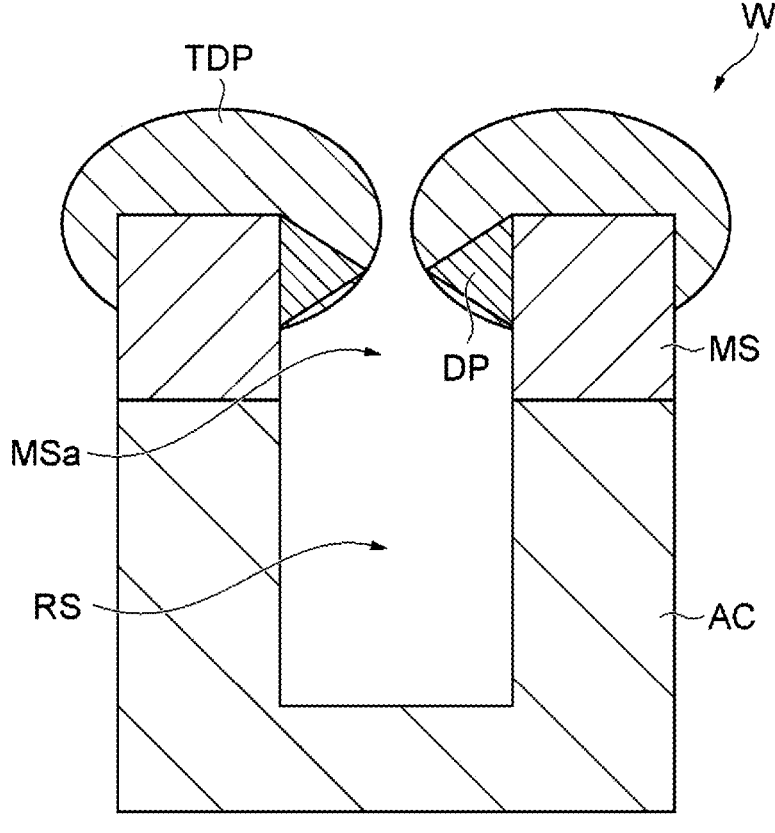
FIG. 23 is a cross-sectional view illustrating a step of an etching method according to an embodiment.

In step ST31, a deposit TDP is preferentially formed on the mask MS as illustrated in FIG. 23. The deposit TDP may be a carbon-containing deposit. The deposit TDP is formed on the top surface of the mask MS. The thickness of the deposit TDP on the top surface of the mask MS is larger than the thickness of the deposit TDP on the bottom of the recess RS. The deposit TDP may be formed by the CVD method. In an embodiment, the deposit TDP is formed by plasma generated from a processing gas that includes carbon. The processing gas may include a gas containing carbon and hydrogen. The gas containing carbon and hydrogen may be hydrocarbon gas. Examples of the hydrocarbon gas include methane gas and acetylene gas. The processing gas may further include an inert gas such as nitrogen gas.

(Step ST3)

In step ST3, hydrogen fluoride reacts with the deposit TDP to produce a fluidized product DP2, and the fluidized product DP2 moves toward the bottom of the recess RS, as illustrated in FIGS. 24A to 24D. At the time when step ST3 is completed, the product DP2 may be deposited on the bottom of the recess RS as illustrated in FIG. 24D. At the time when step ST3 is completed, the product DP2 may be deposited on the side wall of the recess RS. The product DP2 may include carbon. The product DP2 may include a polymer. The product DP2 may further include at least one element selected from the group consisting of hydrogen, fluorine, and oxygen.

In step ST31, the deposit DP may be covered by the deposit TDP as illustrated in FIG. 23. In this case, the product DP2 is deposited on the bottom of the recess RS in step ST3 according to, for example, the following mechanism. First, when the fluidized product DP2 moves toward the bottom of the recess RS, the deposit DP is exposed as illustrated in FIG. 24B. As a result, the reaction between the hydrogen fluoride molecules HF1 and the deposit DP and the reaction between the hydrogen fluoride molecules HF1 and the deposit TDP proceed simultaneously. As illustrated in FIG. 24C, when the deposit DP is removed earlier, the fluidized product DP2 moves toward the bottom of the recess RS after the deposit DP is removed. Meanwhile, when the deposit TDP is removed earlier due to the movement of the fluidized product DP2, the vaporization of the deposit DP proceeds after the deposit TDP is removed.

In step ST31, the deposit DP may be exposed without being covered by the deposit TDP. In this case, the product DP2 is deposited on the bottom of the recess RS in step ST3 according to, for example, the following mechanism. First, the reaction between the hydrogen fluoride molecules HF1 and the deposit DP and the reaction between the hydrogen fluoride molecule HF1 and the deposit TDP proceed simultaneously. As illustrated in FIG. 24C, when the deposit DP is removed earlier, the fluidized product DP2 moves toward the bottom of the recess RS after the deposit DP is removed. Meanwhile, when the deposit TDP is removed earlier due to the movement of the fluidized product DP2, the vaporization of the deposit DP proceeds after the deposit TDP is removed.

According to the method MT4 above, the product DP2 may be deposited on the bottom of the recess RS in step ST31. The larger the dimension of the opening MSa of the mask MS, the larger the amount of product DP2 deposited on the bottom of the recess RS. The larger the amount of product DP2, the smaller the dimension of the recess RS. Thus, even when the substrate W has a plurality of recesses RS, of which dimensions are significantly different, before step ST31, the difference in dimension among the plurality of recesses RS may be reduced by performing steps ST31 and ST3.

Figure 25:
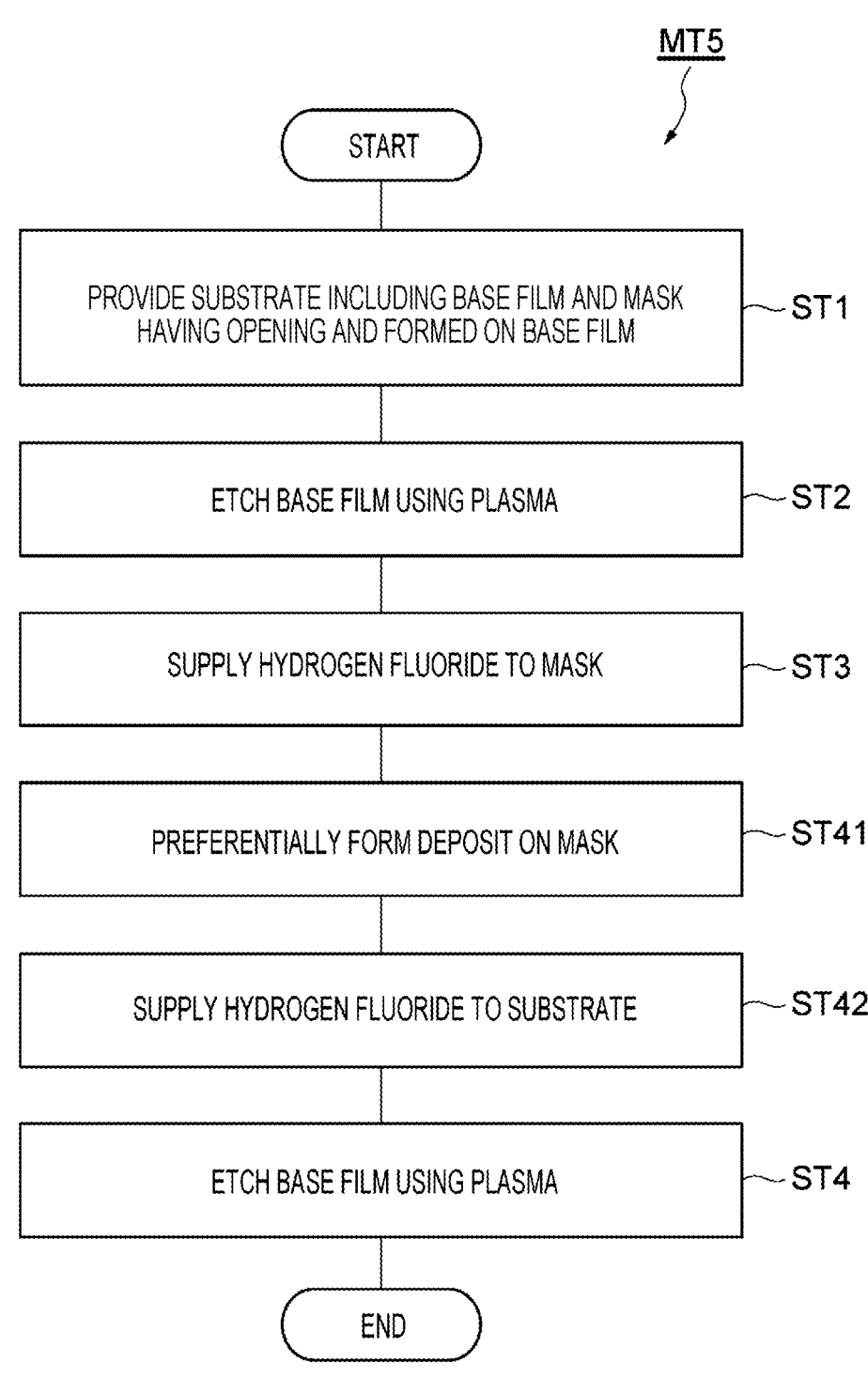
FIG. 25 is a flowchart of an etching method according to an embodiment.

FIG. 25 is a flowchart of an etching method according to an embodiment. An etching method MT5 illustrated in FIG. 25 (hereinafter, referred to as a "method MT5") may be performed by the plasma processing apparatus 1 of the embodiment described above. The method MT5 may be applied to the substrate W of FIG. 4. The method MT5 may be performed identically to the method MT1, except for the points described below.

As illustrated in FIG. 25, the method MT5 includes steps ST41 and ST42, in addition to steps ST1 to ST4. Step ST41 may be performed between steps ST3 and ST4. Step ST42 may be performed between steps ST41 and ST4. Step ST41 or ST42 may be performed in the same chamber as the other steps ST1 to ST4 or in a different chamber from that of the other steps ST1 to ST4.

(Step ST41) Step ST41 may be performed identically to step ST31.

(Step ST42)

Step ST42 may be performed identically to step ST3.

According to the method MT5 described above, after removing the deposit DP adhering to the opening MSa of the mask MS in step ST3, the deposit TDP may be preferentially formed on the mask MS in step ST41. Then, the product DP2 may be deposited on the bottom of the recess RS in step ST42.

In the methods MT4 and MT5, steps ST1 and ST2 may not be performed. In the method MT4, before stop ST31, the substrate W may be prepared, which includes the base film AC having the recess RS and the mask MS having the opening MSa.

Hereinafter, various experiments conducted for evaluating the methods MT4 and MT5 will be described. The experiments described below are not intended to limit the present disclosure.

12th Experiment

In a 12th experiment, a substrate having an amorphous carbon film and a mask formed on the amorphous carbon film was prepared. Then, steps ST1, ST2, ST31, and ST3 of the method MT4 described above were performed sequentially on the substrate by using the plasma processing apparatus 1. In step ST1, the substrate was placed on the substrate support inside the chamber. In step ST2, a processing gas was supplied into the chamber, and the amorphous carbon film was etched using plasma generated from the processing gas to form a recess. In step ST31, a processing gas that includes methane gas and nitrogen gas was supplied into the chamber, and a deposit was preferentially formed on the mask using plasma generated from the processing gas. The duration of step ST31 was 30 seconds. In step ST3, a processing gas that includes hydrogen fluoride gas and argon gas was supplied into the chamber. In step ST3, the pressure inside the chamber was 40 Pa (300 mTorr), the temperature of the substrate support was $-60°$ C., and the duration of step ST3 was 10 seconds. No plasma was generated during step ST3. The deposit adhering to the opening of the mask was removed through step ST3.

13rd Experiment

A 13rd experiment was conducted identically to the 12th experiment, except that the duration of step ST31 was 60 seconds.

14th Experiment

A 14th experiment was conducted identically to the 12th experiment, except that step ST31 was not performed.

Sixth Experimental Result

In the 12th to 14th experiments, an image of the cross section of the substrate after performing the method MT4 was observed. In the 12th experiment, a deposit was formed on the side wall of the recess of the amorphous carbon film. In the 13th experiment, a deposit was formed on the side wall and the bottom of the recess of the amorphous carbon film. The thickness of the deposit formed on the bottom was 196 nm. In the 14th experiment, no deposit was formed on the side wall and the bottom of the recess of the amorphous carbon film. Therefore, it may be identified that the deposit on the mask reacts with hydrogen fluoride, and the fluidized product moves toward the bottom of the recess.

Figure 26:
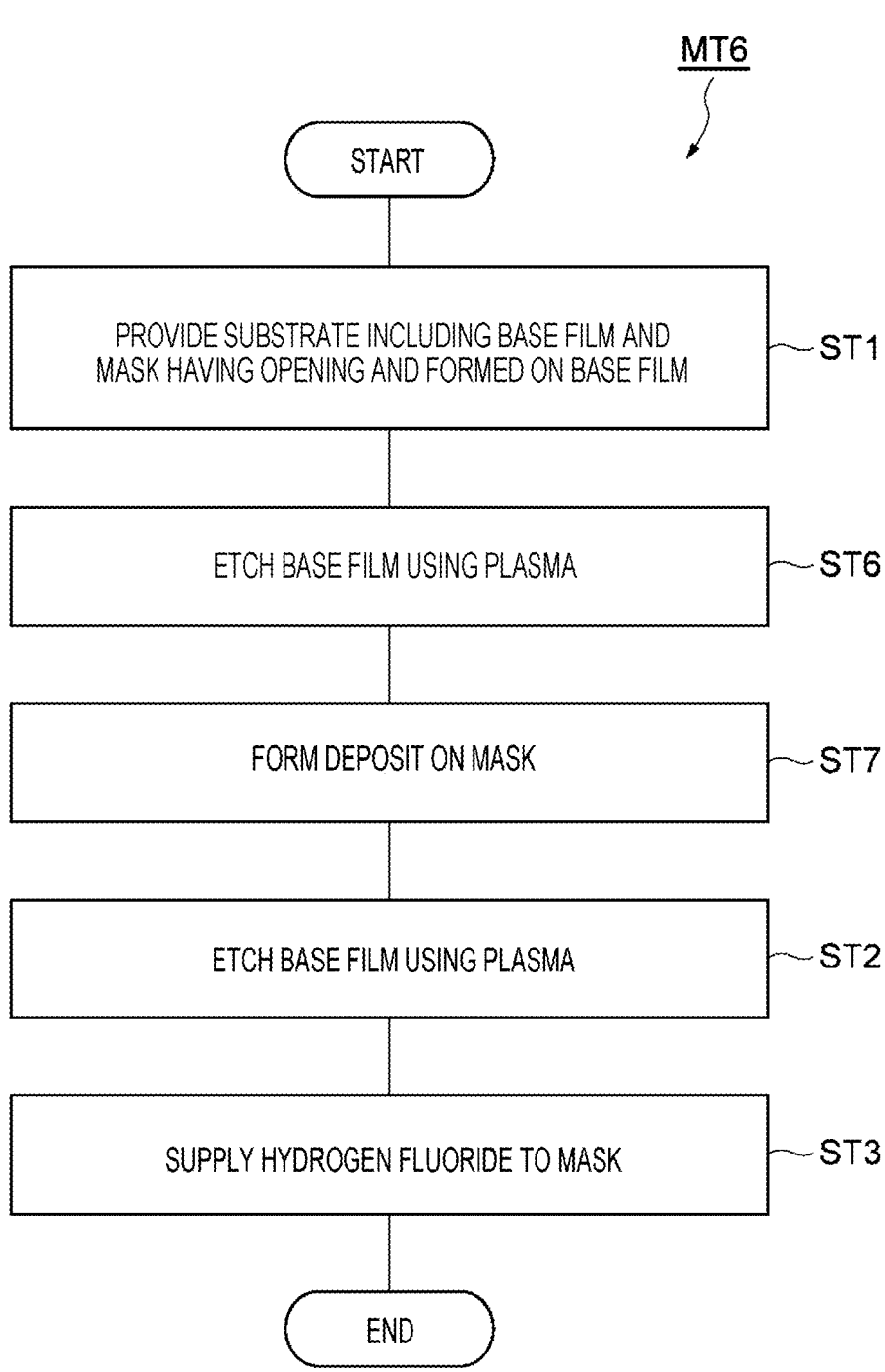
FIG. 26 is a flowchart of an etching method according to an embodiment.
Figure 27:
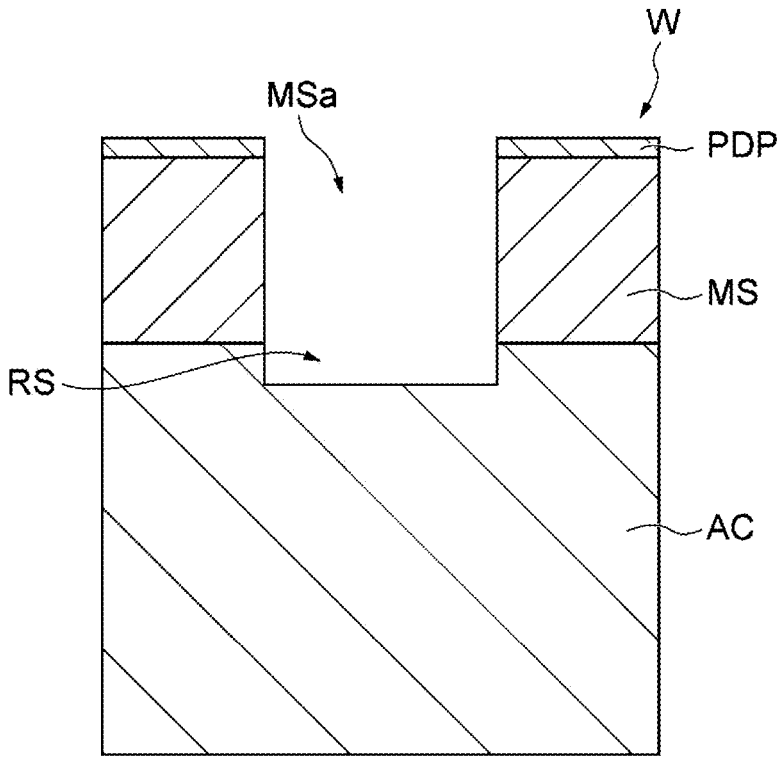
FIG. 27 is a cross-sectional view illustrating a step of an etching method according to an embodiment.

FIG. 26 is a flowchart of an etching method according to an embodiment. An etching method MT6 illustrated in FIG. 26 (hereinafter, referred to as a "method MT6") may be performed by the plasma processing apparatus 1 of the embodiment described above. The method MT6 may be applied to the substrate W of FIG. 4. FIG. 27 is a cross-sectional view illustrating a step of an etching method according to an embodiment.

As illustrated in FIG. 26, the method MT6 may include steps ST6 and ST7, in addition to steps ST1 to ST3. Steps ST6 and ST7 may be sequentially performed between steps ST1 and ST2. The method MT6 may not include at least one of steps ST6 and ST7. Steps ST6 and ST7 may be performed in the same chamber as that of the other steps ST1 to ST3 or in a different chamber from that of the other steps ST1 to ST3.

(Step ST6)

Step ST6 may be performed identically to step ST2 of the method MT1. The duration of step ST6 may be shorter than the duration of step ST2. The recess RS is formed in the base film AC through step ST6.

(Step ST7)

In step ST7, a deposit PDP is formed on the mask MS as illustrated in FIG. 27. The deposit PDP includes at least one element selected from the group consisting of phosphorus, boron, and sulfur. The deposit PDP is formed on the top surface of the mask MS. The deposit PDP may be formed on the side wall of the mask MS that defines the opening MSa, or may be formed on the base film AC. The deposit PDP may be formed on the side wall of the recess RS. The thickness of the deposit PDP on the top surface of the mask MS may be larger or smaller than the thickness of the deposit PDP formed on the base film AC.

The deposit PDP may be formed by the CVD method. In an embodiment, the deposit PDP is formed by plasma generated from a processing gas. The processing gas includes at least one element selected from the group consisting of phosphorus, boron, and sulfur. The processing gas may include halogen. Examples of halogen include fluorine and chlorine. The processing gas may include oxygen. The processing gas may include at least one gas selected from the group consisting of a phosphorus-containing gas, a boron-containing gas, and a sulfur-containing gas. Examples of the phosphorus-containing gas include at least one selected from phosphorus fluoride ($PF_x$), phosphorus chloride ($PCl_x$), phosphoryl fluoride ($POF_x$), and phosphorus oxychloride ($POCl_x$). Examples of phosphorus fluoride include $PF_3$ or $PF_5$. Examples of phosphorus chloride include $PCl_3$ or $PCl_5$. Examples of phosphoryl fluoride include $POF_3$. Examples of phosphorus oxychloride include $POCl_3$. Examples of the boron-containing gas include boron fluoride (BFx), boron chloride ($BCl_x$), and $BOF_x$. Examples of the sulfur-containing gas include at least one selected from the group consisting of sulfur fluoride ($SF_x$), sulfur chloride ($SCl_x$), carbonyl sulfide (COS), sulfur dioxide ($SO_2$), hydrogen sulfide ($H_2S$), and carbon disulfide ($CS_2$). The "x" is a positive real number. The processing gas may further include an inert gas such as a noble gas. Examples of the noble gas include argon (Ar).

(Step ST2)

In step ST2, the base film AC is etched using plasma, as illustrated in FIG. 5. Step ST2 may be performed identically to step ST2 of the method MT1. In step ST2, when the base film AC is etched, the deposit PDP and the mask MS are also etched. Thus, the deposit PDP formed in step ST2 includes at least one element selected from the group consisting of phosphorus, boron, and sulfur. This element is derived from the deposit PDP of FIG. 27.

(Step ST3)

In step ST3, hydrogen fluoride is supplied to the mask MS to remove the deposit DP as illustrated in FIGS. 6 and 7. Step ST3 may be performed identically to step ST3 of the method MT1. In step ST3, water ($H_2O$) may be produced by the reaction between the deposit DP and hydrogen fluoride. When the deposit DP includes silicon and oxygen, silicon tetrafluoride ($SiF_4$) and water ($H_2O$) are produced by the reaction between silicon oxide and hydrogen fluoride. When the deposit DP includes phosphorus, water reacts with phosphorus of the deposit DP so that phosphoric acid ($H_3PO_4$) is formed. Since phosphoric acid stabilizes the adsorption of water to silicon oxide, the volatilization of water from the deposit DP is suppressed. When water remains on the surface of the deposit DP, the adsorption of the hydrogen fluoride molecules (HF1) to the deposit DP is accelerated, and thus, the removal of the deposit DP is also accelerated. When the deposit DP includes boron, water reacts with boron in the deposit DP so that boric acid ($H_3BO_3$) is formed. Since the boric acid stabilizes the adsorption of water to silicon oxide, the volatilization of water from the deposit DP is suppressed. When water remains on the surface of the deposit DP, the adsorption of the hydrogen fluoride molecules (HF1) to the deposit DP is accelerated, and thus, the removal of the deposit DP is also accelerated. When the deposit DP includes sulfur, water reacts with sulfur of the deposit DP so that sulfuric acid ($H_2SO_4$) is formed. Since sulfuric acid stabilizes the adsorption of water to silicon oxide, the volatilization of water from the deposit DP is suppressed. When water remains on the surface of the deposit DP, the adsorption of the hydrogen fluoride molecules (HF1) to the deposit DP is accelerated, and thus, the removal of the deposit DP is also accelerated.

Figure 28:
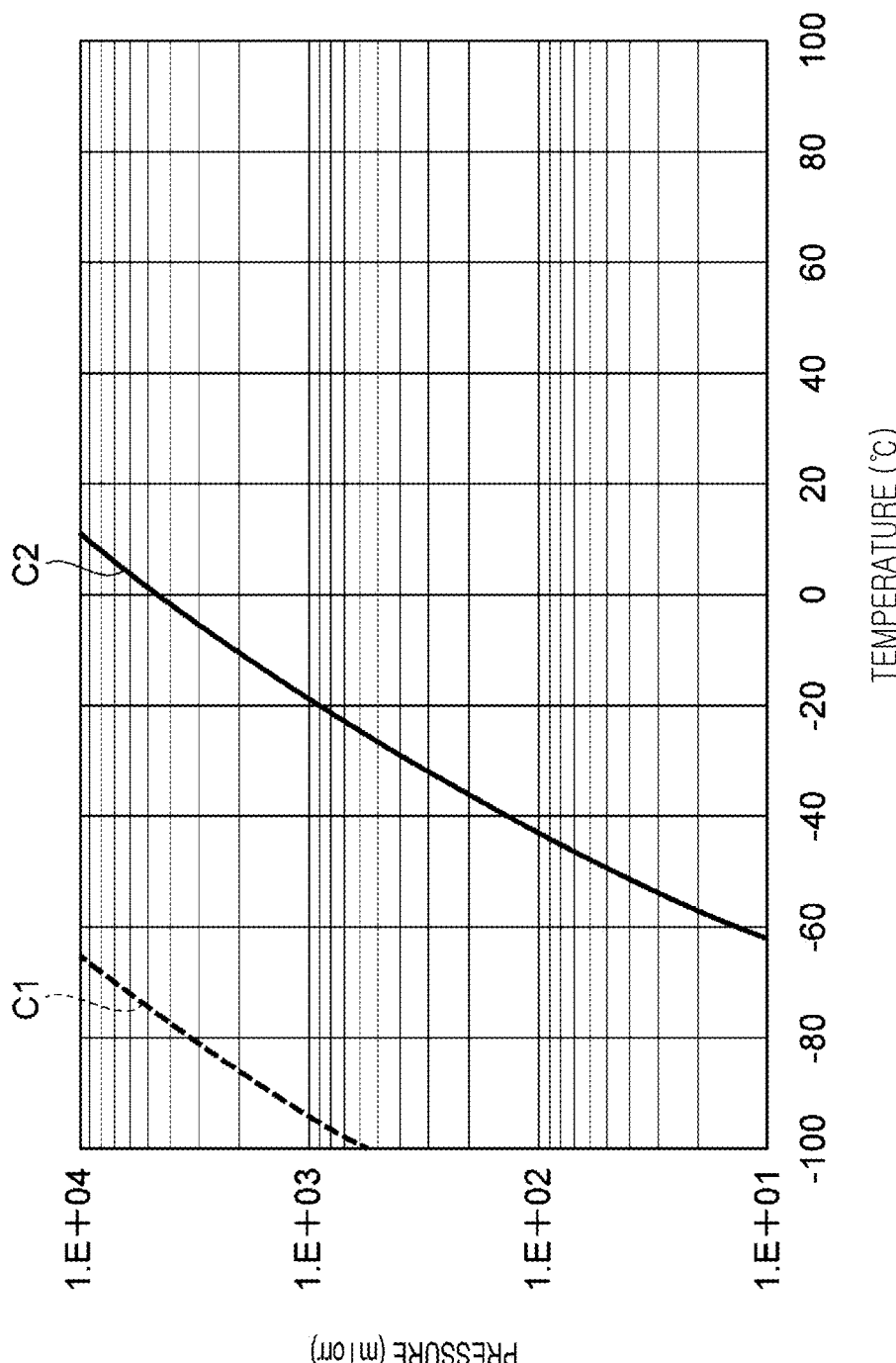
FIG. 28 is a graph representing an example of a relationship between a pressure and a temperature during a process of supplying hydrogen fluoride.

FIG. 28 is a graph illustrating an example of the relationship between the pressure and the temperature in step ST3. In the graph, the curve C1 represents a saturated vapor pressure curve of hydrogen fluoride. The curve C2 represents a saturated vapor pressure curve of water ($H_2O$). The pressure in step ST3 may be larger than the saturated vapor pressure of water ($H_2O$). In this case, water, which is liquid, may remain on the deposit DP. The pressure in step ST3 may be equal to or less than the saturated vapor pressure of hydrogen fluoride. In this case, hydrogen fluoride gas may be adsorbed to the deposit DP. In the region between the curves C1 and C2, the adsorption of hydrogen fluoride molecules HF1 is accelerated by water remaining as liquid on the deposit DP. Accordingly, the removal of the deposit DP may be accelerated even when the pressure in step ST3 is small.

The pressure in step ST3 may be 13.3 Pa (100 mTorr) or more, and preferably 26.6 Pa (200 mTorr) or more. Further, the pressure in step ST3 may be 134 Pa (1,000 mTorr) or less, and preferably 67 Pa (500 mTorr) or less. In step ST3, the temperature of the substrate support 11 is −80° C. or higher, or may be 100° C. or lower.

According to the method MT6 above, the removal amount of deposit DP in step ST3 may be increased. As a result, the dimension CD of the opening MSa of the mask MS may be expanded. Further, when the method MT6 includes step ST6, the deposit PDP is formed on the side wall of the recess RS in step ST7. As a result, the etching of the side wall of the recess RS may be suppressed in step ST2.

When the mask MS includes at least one element selected from the group consisting of phosphorus, boron, and sulfur, the method MT6 may not include step ST7. The deposit DP formed in step ST2 includes at least one element selected from the group consisting of phosphorus, boron, and sulfur. This element is derived from the mask MS. Therefore, the removal amount of deposit DP in step ST3 may be increased even when step ST7 is not performed.

Hereinafter, descriptions will be made on various experiments conducted for evaluating the method MT6. The experiments described below are not intended to limit the present disclosure.

15th Embodiment

In a 15th experiment, a substrate having an amorphous carbon film and a mask provided on the amorphous carbon film was prepared. The mask is a silicon oxynitride film. Then, steps ST1, ST6, ST7, ST2, and ST3 of the method MT6 described above were sequentially performed on the substrate by using the plasma processing apparatus 1 described above. In step ST1, the substrate was placed on the substrate support inside the chamber. In step ST6, the processing gas was supplied into the chamber, and the amorphous carbon film was etched using plasma generated from the processing gas. The duration of step ST6 was 30 seconds. In step ST7, a processing gas that includes a phosphorus-containing gas and argon gas was supplied into the chamber, and a phosphorus-containing deposit was formed on the top surface of the mask using plasma generated from the processing gas. In step ST2, a processing gas was supplied into the chamber, and the amorphous carbon film was etched using plasma generated from the processing gas. Step ST2 was performed identically to step ST6, except that the duration was 180 seconds. In step ST3, a processing gas that includes hydrogen fluoride gas and argon gas was supplied into the chamber. In step ST3, the pressure inside the chamber was 127 Pa (950 mTorr), the temperature of the substrate support was 0° C., and the duration of step ST3 was 10 seconds. No plasma was generated during step ST3. The deposit adhering to the opening of the mask was removed through step ST3.

16th Experiment

In a 16th experiment, the method MT6 was performed identically to the 15th experiment, except that the pressure in the chamber during step ST3 was set to 66.7 Pa (500 mTorr).

17th Experiment

In a 17th experiment, the method MT6 was performed identically to the 15th experiment, except that the pressure in the chamber during step ST3 was set to 40 Pa (300 mTorr).

18th Experiment

In a 18th experiment, the method MT6 was performed identically to the 15th experiment, except that the pressure in the chamber during step ST3 was set to 26.6 Pa (200 mTorr).

19th Experiment

In a 19th experiment, the method MT6 was performed identically to the 15th experiment, except that step ST7 was not performed.

20th Experiment

In a 20th experiment, the method MT6 was performed identically to the 19th experiment, except that the pressure in the chamber during step ST3 was set to 107 Pa (800 mTorr).

21th Experiment

In a 21st experiment, the method MT6 was performed identically to the 19th experiment, except that the pressure in the chamber during step ST3 was set to 66.7 Pa (500 mTorr).

Seventh Experimental Result

In the 15th and 19th experiments, the dimension CD of the opening of the mask (see, e.g., FIG. 5) was measured from an image of the cross section of the substrate before performing step ST3. In the 15th to 21st experiments, the dimension CD of the opening of the mask (see, e.g., FIG. 7) was measured from an image of the cross section of the substrate after performing the method MT6.

In the 15th experiment, the opening dimension before performing step ST3 was 45.5 nm, and the opening dimension after performing the method MT6 was 76.9 nm. In the 16th experiment, the opening dimension after performing the method MT6 was 78.4 nm. In the 17th experiment, the opening dimension after performing the method MT6 was 71.8 nm. In the 18th experiment, the opening dimension after performing the method MT6 was 75.8 nm. These results confirm that the opening dimension of the mask may be expanded in the 15th to 18th experiments.

In the 19th experiment, the opening dimension before performing step ST3 was 44 nm, and the opening dimension after performing the method MT6 was 60 nm. In the 20th experiment, the opening dimension after performing the method MT6 was 49 nm. In the 21st experiment, the opening dimension after performing the method MT6 was 50 nm. These results confirm that the opening dimension of the mask may be expanded in the 19th to 21st experiments.

Further, from the results of the 15th to 21st experiments, it may be identified that the opening dimension of the mask may be expanded when step ST7 is performed, as compared to a case where step ST7 is not performed. Therefore, it may be identified that by forming the phosphorus-containing deposit on the top surface of the mask, the removal amount of the deposit DP by hydrogen fluoride may be increased.

Figure 29:
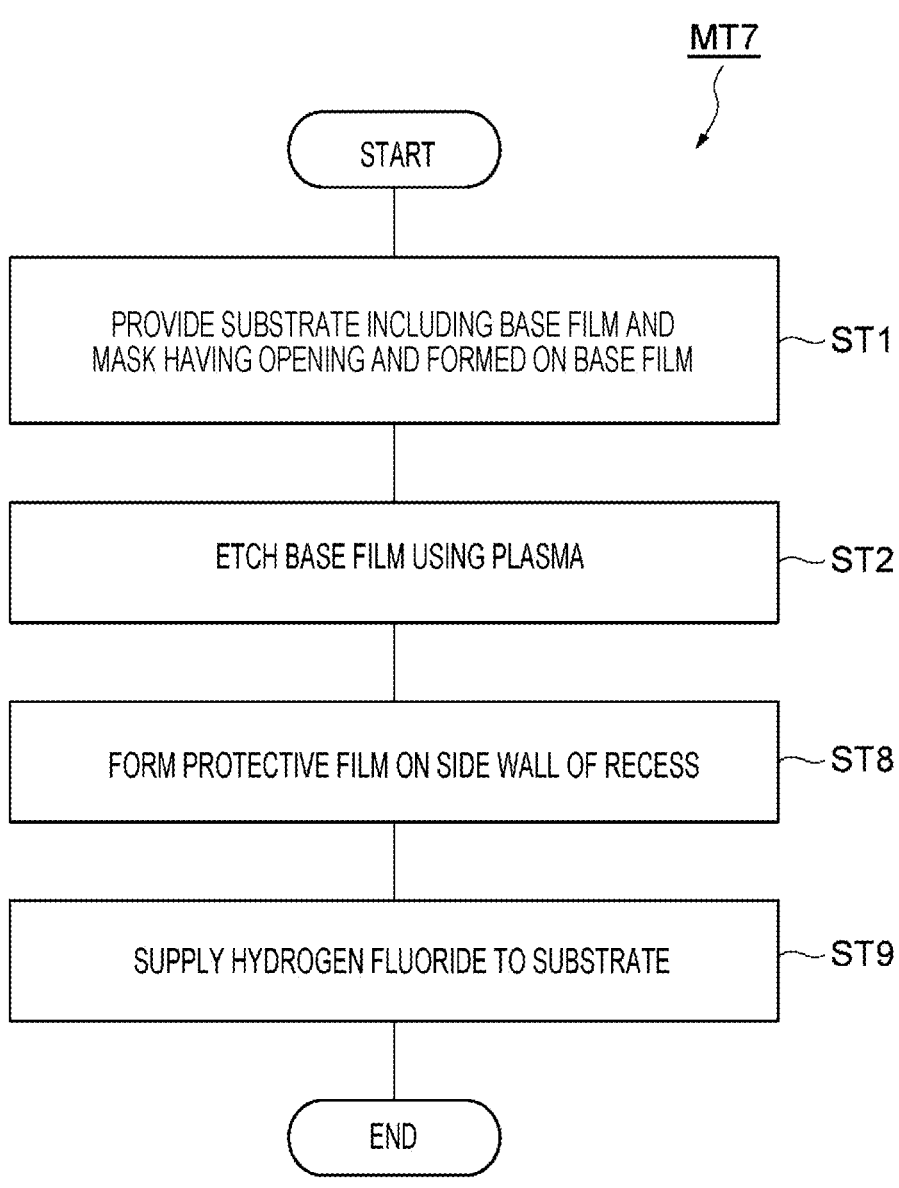
FIG. 29 is a flowchart of an etching method according to an embodiment.
Figure 30:
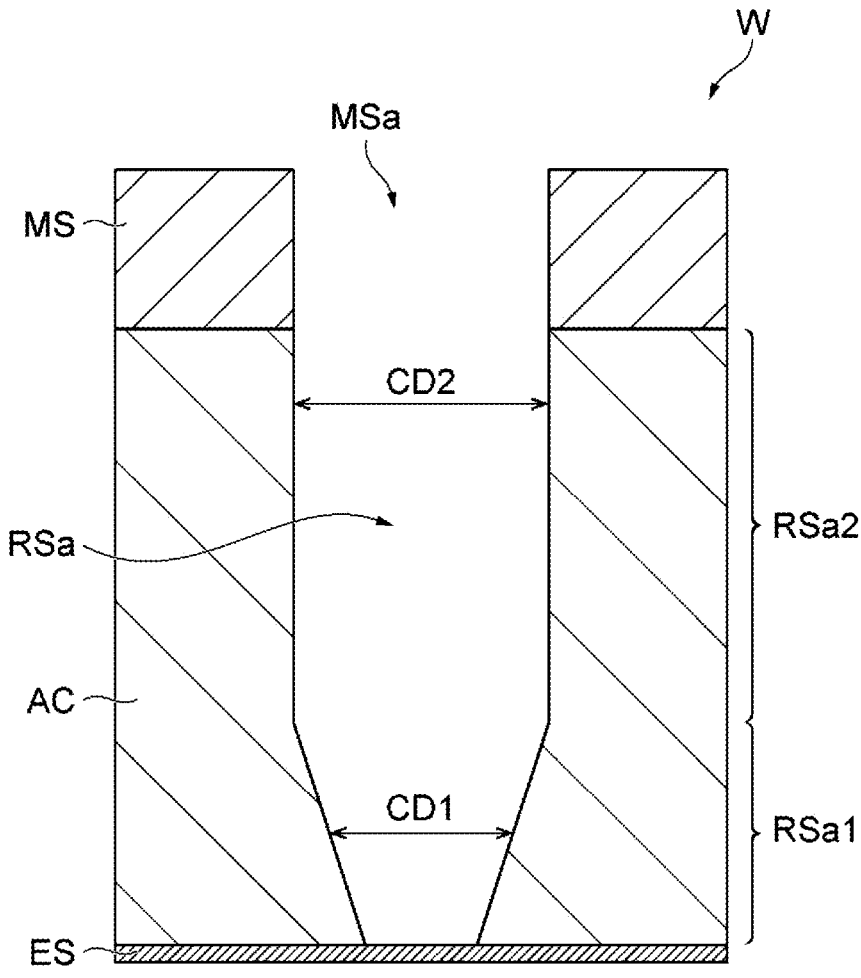
FIG. 30 is a cross-sectional view illustrating a step of of an etching method according to an embodiment.
Figure 31:
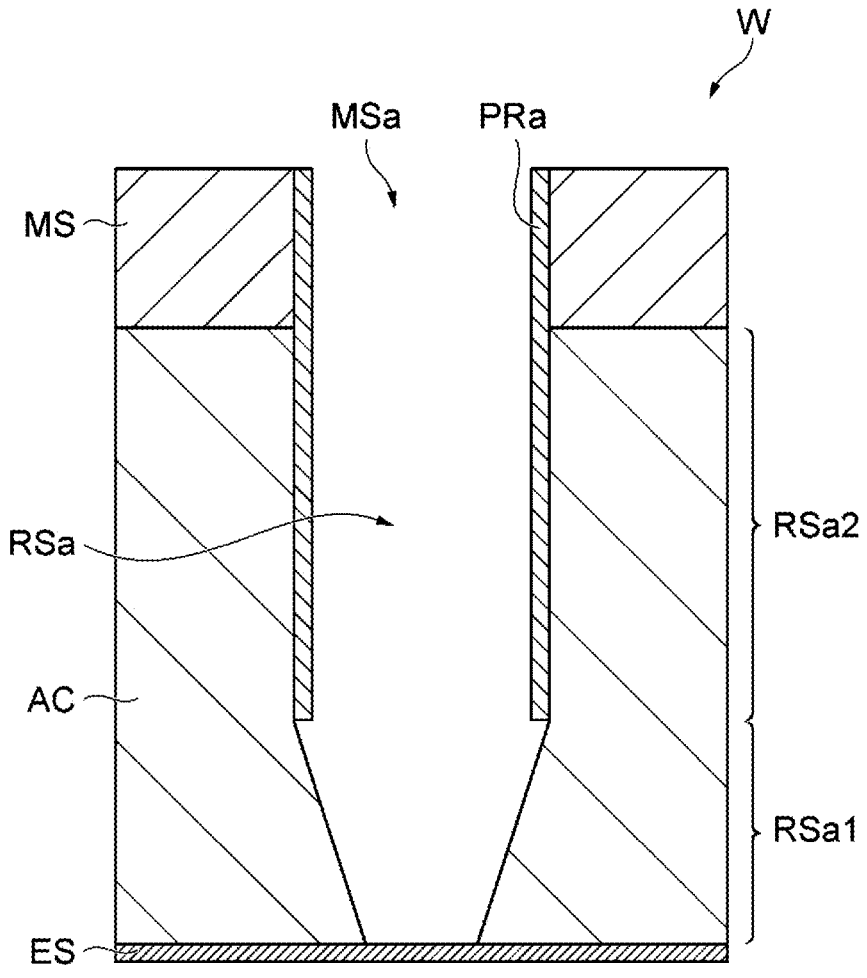
FIG. 31 is a cross-sectional view illustrating a step of an etching method according to an embodiment.
Figure 32:
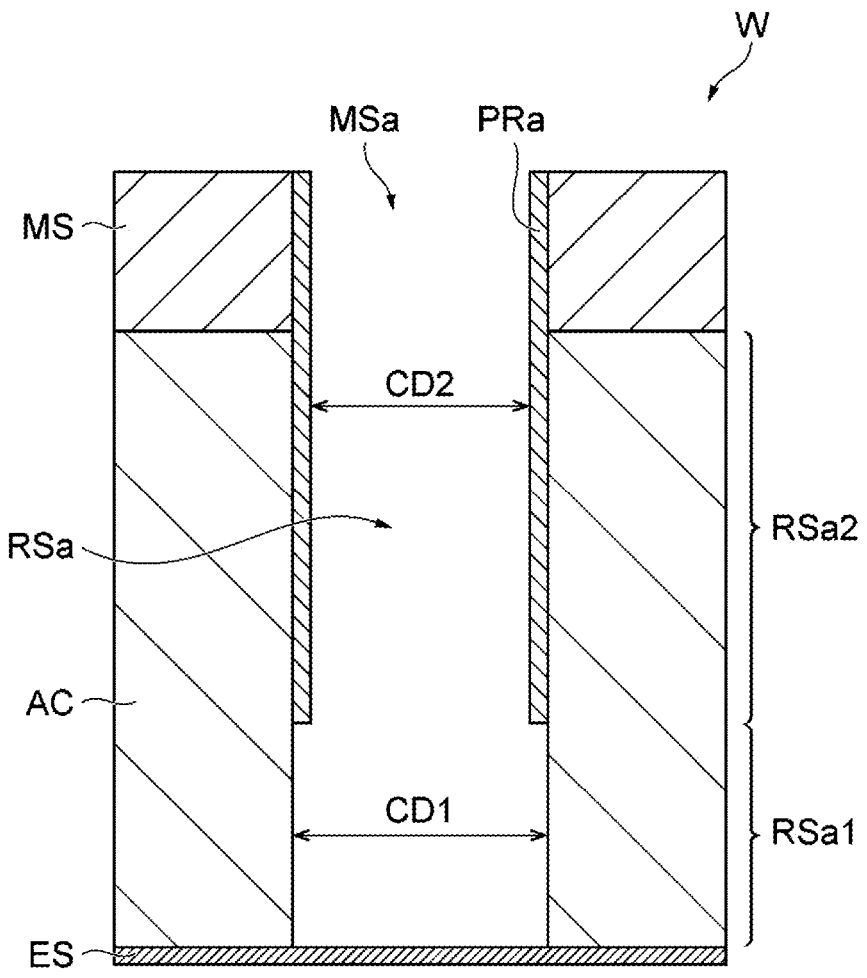
FIG. 32 is a cross-sectional view illustrating a step of an etching method according to an embodiment.

FIG. 29 is a flowchart of an etching method according to an embodiment. An etching method MT7 (hereinafter, referred to as a "method MT7") illustrated in FIG. 29 may be performed by the plasma processing apparatus 1 of the embodiment described above. The method MT7 may be applied to the substrate W of FIG. 4. The method MT7 may be performed identically to the method MT1, except for the points described below. FIGS. 30 to 32 are each a cross-sectional view of a step of an etching method according to an embodiment.

As illustrated in FIG. 29, the method MT7 includes steps ST1, ST2, ST8, and ST9. Steps ST1, ST2, ST8, and ST9 may be sequentially performed. Step ST9 may be performed in the same chamber as that of the other steps ST1, ST2, and ST8, or in a different chamber from that of the other steps ST1, ST2, and ST8.

The method MT7 may be performed when a recess RSa is formed in step ST2 as illustrated in FIG. 30. In an embodiment, the base film AC is a silicon-containing film, and the mask MS is a carbon-containing film or a metal-containing film. The substrate W may further include an etching stop layer ES, at which the etching for forming the recess RSa is stopped. The base film AC is disposed between the mask MS and the etching stop layer ES. The recess RSa includes a first portion RSa1 and a second portion RSa2 on the first portion RSa1. The first portion RSa1 is disposed at the bottom of the recess RSa. The second portion RSa2 is located at the opening end of the recess RSa. The opening dimension CD1 of the first portion RSa1 is smaller than the opening dimension CD2 of the second portion RSa2. For example, the recess RSa has a tapered cross-sectional shape, in which the opening dimension gradually decreases from the opening end toward the bottom.

(Step ST8)

In step ST8, as illustrated in FIG. 31, a protective film PRa is formed on the side wall that defines the second portion RSa2 of the recess RSa. The protective film PRa is selectively formed on the side wall that defines the second portion RSa2, and is not formed on the side wall that defines the first portion RSa1. The protective film PRa may be formed on the side wall that defines the opening MSa of the mask MS. The protective film PRa may be formed, for example, by the unsaturated ALD method, the MLD method, or the CVD method described above.

(Step ST9)

In step ST9, hydrogen fluoride gas is supplied to the substrate W. Step ST9 may be performed identically to step ST3. As illustrated in FIG. 32, the side wall that defines the first portion RSa1 is etched by the hydrogen fluoride gas. As a result, the opening dimension CD1 of the first portion RSa1 expands. Meanwhile, the side wall that defines the second portion RSa2 is hardly etched due to the protective film PRa. Therefore, the variation of the opening dimension CD2 of the second portion RSa2 is suppressed.

According to the method MT7 above, as illustrated in FIG. 32, the protective film PRa makes it possible to expand the opening dimension CD1 of the first portion RSa1 while suppressing the variation of the opening dimension CD2 of the second portion RSa2 of the recess RSa.

Here, various embodiments included in the present disclosure are described in [E1] to [E28] below.

[E1]

An etching method including:

(a) providing a substrate with a base film and a mask formed on the base film, and having an opening;

(b) etching the base film using plasma; and (c) supplying hydrogen fluoride to the substrate under a pressure of 13.3 Pa or higher.

According to the etching method [E1], a deposit adhering to, for example, the opening of the mask may be removed by hydrogen fluoride in (c). The mechanism for removing the deposit is described as follows, but is not limited thereto. When the pressure is high during (c), the amount of hydrogen fluoride molecules adsorbed to the deposit in (c) increases, so that more deposit is removed.

[E2]

The etching method according to [E1], wherein in (c), a deposit adhering to the opening of the mask due to (b) is removed.

[E3]

The etching method according to [E1] or [E2], wherein the pressure in (c) is equal to or lower than a saturated vapor pressure of hydrogen fluoride.

[E4]

The etching method according to any one of [E1] to [E3], wherein in (c), a temperature of a substrate support supporting the substrate is −80° C. or higher.

[E5]

The etching method according to any one of [E1] to [E4], wherein in (c), a temperature of a substrate support supporting the substrate is 100° C. or lower.

[E6]

The etching method according to any one of [E1] to [E5], wherein in (c), hydrogen fluoride gas is supplied without generating plasma.

[E7]

The etching method according to any one of [E1] to [E6], wherein in (c), hydrofluoric acid is supplied.

[E8]

The etching method according to any one of [E1] to [E7], further including: (d) after (c), etching the base film using plasma.

[E9]

The etching method according to [E8], further including: (e) after (d), supplying hydrogen fluoride to the substrate under a pressure of 13.3 Pa or higher thereby removing a deposit adhering to the substrate due to (d).

[E10]

The etching method according to any one of [E1] to [E9], wherein the mask contains at least one of silicon, metal, and carbon.

[E11]

The etching method according to any one of [E1] to [E10], wherein the base film contains at least one of silicon, metal, and carbon.

[E12]

The etching method according to any one of [E1] to [E11], wherein in (c), a hydrogen-containing gas is further supplied to the mask.

In this case, the hydrogen-containing gas accelerates the adsorption of hydrogen fluoride to the deposit.

[E13]

The etching method according to any one of [E1] to [E12], further including: (f) after (c), supplying a silicon-containing gas to the substrate.

[E14]

The etching method according to [E13], wherein in (f), hydrogen fluoride is supplied to the substrate.

[E15]

The etching method according to [E13] or [E14], wherein in (f), the silicon-containing gas includes nitrogen.

[E16]

The etching method according to [E15], wherein in (f), the silicon-containing gas is aminosilane including a hydrocarbon group, and in (f), a deposit is formed on the substrate, and the deposit contains nitrogen, fluorine, carbon, hydrogen, and silicon.

[E17]

The etching method according to any one of [E1] to [E16], further including: (g) after (c), forming a film on a side wall of a recess formed by etching the base film.

[E18]

The etching method according to [E17], wherein the film is formed by an ALD method, an unsaturated ALD method, an MLD method, or a CVD method.

[E19]

The etching method according to any one of [E1] to [E18], wherein (b) includes forming a film on the side wall of the recess formed by etching the base film.

[E20]

The etching method according to any one of [E1] to [E19], further including: (h) between (b) and (c), preferentially forming a carbon-containing deposit on the mask.

[E21]

The etching method according to any one of [E1] to [E20], further including:

(i) after (c), preferentially forming a carbon-containing deposit on the mask; and (j) after (i), supplying hydrogen fluoride to the substrate under a pressure of 13.3 Pa or higher.

[E22]

The etching method according to any one of [E1] to [E21], further including: (k) before (b), forming a deposit including at least one element selected from the group consisting of phosphorus, boron, and sulfur, on the mask.

[E23]

The etching method according to any one of [E1] to [E22], wherein the mask includes at least one element selected from the group consisting of phosphorus, boron, and sulfur.

[E24]

The etching method according to any one of [E1] to [E23], wherein a substrate support supporting the substrate includes a first region and a second region different from the first region, and in (c), a temperature of the first region is controlled to a first temperature, and a temperature of the second region is controlled to a second temperature different from the first temperature.

[E25]

The etching method according to any one of [E1] to [E24], wherein by (b), a recess is formed in the base film, the recess including a first portion and a second portion on the first portion, an opening dimension of the first portion is smaller than an opening dimension of the second portion, the etching method further includes:

(l) between (b) and (c), forming a protective film on a side wall of the recess that defines the second portion, and (c) expands an opening dimension of the first portion.

[E26]

An etching method including:

(a) providing a substrate including a base film having a recess and a mask formed on the base film and having an opening, the opening corresponding to the recess;

(b) preferentially forming a deposit on the mask; and (c) supplying hydrogen fluoride to the substrate under a pressure of 13.3 Pa or higher.

[E27]

A plasma processing apparatus including:

a chamber;

a substrate support configured to support a substrate in the chamber, the substrate including a base film and a mask formed on the base film and having an opening;

a gas supply configured to supply each of a first processing gas and a second processing gas that includes hydrogen fluoride gas, into the chamber;

a plasma generator configured to generate plasma from the first processing gas in the chamber; and a controller, wherein the controller is configured to control the gas supply and the plasma generator to etch the base film using the plasma, and wherein the controller is configured to control the gas supply to supply the second processing gas to the substrate under a pressure of 13.3 Pa or higher.

[E28]

An etching method including:

(a) providing a substrate including a base film and a mask formed on the base film and having an opening;

(b) etching the base film using plasma; and (c) supplying hydrogen fluoride to the substrate, wherein in (c), a temperature of a substrate support supporting the substrate is −80° C. or higher.

According to the etching method [E28], the deposit may be removed by hydrogen fluoride in (c). The mechanism for removing the deposit is described as follows, but is not limited thereto. In (c), when the temperature of the substrate support is high, the reaction between hydrogen fluoride and the deposit is accelerated, so that more deposit is removed.

According to an embodiment, it is possible to provide an etching method and a plasma processing apparatus, which may remove a deposit adhering to a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:

(a) providing a substrate including a base film and a mask formed on the base film, the mask having an opening;

(b) etching the base film using plasma;

(c) supplying hydrogen fluoride to the substrate under a pressure of 13.3 Pa or higher; and (f) after (c), supplying a silicon-containing gas to the substrate.

2. The etching method according to claim 1, wherein (c) further comprises removing a deposit adhering to the opening of the mask due to (b).

3. The etching method according to claim 1, wherein the pressure in (c) is equal to or lower than a saturated vapor pressure of hydrogen fluoride.

4. The etching method according to claim 1, wherein in (c), a temperature of a substrate support supporting the substrate is maintained at −80° C. or higher.

5. The etching method according to claim 1, wherein in (c), a temperature of a substrate support supporting the substrate is maintained at 100° C. or lower.

6. The etching method according to claim 1, wherein (c) further comprises supplying hydrogen fluoride gas without generating plasma.

7. The etching method according to claim 1, wherein (c) further comprises supplying hydrofluoric acid.

8. The etching method according to claim 1, wherein the mask contains at least one of silicon, metal, and carbon.

9. The etching method according to claim 1, wherein the base film contains at least one of silicon, metal, and carbon.

10. The etching method according to claim 1, wherein (c) further comprises supplying a hydrogen-containing gas to the mask.

11. The etching method according to claim 1, wherein (f) further comprises supplying hydrogen fluoride to the substrate.

12. The etching method according to claim 1, further comprising:

(g) after (c), forming a film on a side wall of a recess formed by etching the base film.

13. The etching method according to claim 1, further comprising:

(h) between (b) and (c), forming a carbon-containing deposit on the mask.

14. The etching method according to claim 1, further comprising:

(i) after (c), forming a carbon-containing deposit on the mask; and (j) after (i), supplying hydrogen fluoride to the substrate under a pressure of 13.3 Pa or higher.

15. The etching method according to claim 1, further comprising:

(k) before (b), forming a deposit including at least one element selected from the group consisting of phosphorus, boron, and sulfur, on the mask.

16. The etching method according to claim 1, wherein the mask includes at least one element selected from the group consisting of phosphorus, boron, and sulfur.

17. The etching method according to claim 1, wherein a substrate support supporting the substrate includes a first region and a second region different from the first region, and in (c), a temperature of the first region is controlled to a first temperature, and a temperature of the second region is controlled to a second temperature different from the first temperature.

18. The etching method according to claim 1, wherein
a recess is formed in the base film by (b) including a first
    portion and a second portion on the first portion,
an opening dimension of the first portion is smaller than
    an opening dimension of the second portion,
the etching method further comprises: (l) between (b) and
    (c), forming a protective film on a side wall of the
    recess that defines the second portion, and
(c) expands an opening dimension of the first portion.

19. The etching method according to claim 1, further
comprising:
(d) after (c), etching the base film using plasma.

20. The etching method according to claim 19, further
comprising:
(e) after (d), supplying hydrogen fluoride to the substrate
    under a pressure of 13.3 Pa or higher thereby removing
    a deposit adhering to the substrate due to (d).

21. An etching method comprising:
(a) providing a substrate including a base film and a mask
    formed on the base film, the mask having an opening;
(b) etching the base film using plasma;
(c) supplying hydrogen fluoride to the substrate; and
after (c), supplying a silicon-containing gas to the sub-
    strate, wherein in (c), a temperature of a substrate support
    supporting the substrate is maintained at −80° C. or
    higher.

22. A plasma processing apparatus comprising:
a chamber;
a substrate support configured to support a substrate in the
    chamber;
a gas supply configured to supply a first processing gas
    and a second processing gas into the chamber;
a plasma generator configured to generate plasma from
    the first processing gas in the chamber; and
a controller, wherein the controller is configured to
    execute a process comprising:
providing the substrate including a base film and a mask
    formed on the base film, the mask having an opening;
etching the base film using the plasma of the first pro-
    cessing gas;
supplying the second processing gas including hydrogen
    fluoride to the substrate under a pressure of 13.3 Pa or
    higher; and
after supplying the second processing gas, supplying a
    silicon-containing gas to the substrate.

* * * * *